(12) United States Patent
Inaba

(10) Patent No.: US 7,755,077 B2
(45) Date of Patent: Jul. 13, 2010

(54) SEMICONDUCTOR MEMORY DEVICE

(75) Inventor: Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 331 days.

(21) Appl. No.: 12/026,885

(22) Filed: Feb. 6, 2008

(65) Prior Publication Data

US 2009/0014703 A1   Jan. 15, 2009

(30) Foreign Application Priority Data

Feb. 7, 2007   (JP) ............................ 2007-028384

(51) Int. Cl.
*H01L 45/00* (2006.01)
(52) U.S. Cl. ............ 257/5; 257/E27.006; 257/E27.104; 365/158
(58) Field of Classification Search ...................... 257/4, 257/5, E27.006, E27.104; 365/158
See application file for complete search history.

(56) References Cited

U.S. PATENT DOCUMENTS

| 5,695,864 | A | 12/1997 | Slonczewski | |
|---|---|---|---|---|
| 2006/0239064 | A1* | 10/2006 | Liaw | 365/158 |
| 2006/0279983 | A1* | 12/2006 | Hachino et al. | 365/158 |
| 2007/0206406 | A1* | 9/2007 | Ueda et al. | 365/158 |
| 2007/0258281 | A1* | 11/2007 | Ito et al. | 365/158 |
| 2007/0258282 | A1 | 11/2007 | Ueda et al. | |
| 2008/0083918 | A1* | 4/2008 | Aratani et al. | 257/5 |

FOREIGN PATENT DOCUMENTS

| JP | 2005-191523 | 7/2005 |
|---|---|---|
| KR | 2001-34057 | 4/2001 |
| KR | 2004-0041335 | 5/2004 |

OTHER PUBLICATIONS

J. Debrosse, et al., "A 16Mb MRAM Featuring Bootstrapped Write Drivers", IEEE 2004 Symposium on VLSI Circuits Digest of Technical Papers, 2004, pp. 454-457.
M. Durlam, et al., "A 0.18 µm 4Mb Toggling MRAM", IEDM Proceedings, Dec. 2003, 3 Pages.
U.S. Appl. No. 12/032,135, filed Feb. 15, 2008, Inaba.

* cited by examiner

*Primary Examiner*—Kenneth A Parker
*Assistant Examiner*—Paul A Budd
(74) *Attorney, Agent, or Firm*—Oblon, Spivak, McClelland, Maier & Neustadt, L.L.P.

(57) ABSTRACT

A semiconductor memory device includes the first transistor having first and second source/drain diffusion regions positioned below a second bit line to sandwich the first word line therebetween, and the second source/drain diffusion region positioned between the first and second word lines and connected to a first bit line, a second transistor having second and third source/drain diffusion regions positioned below the second bit line to sandwich the second word line therebetween, a first resistive memory element formed below the second bit line above the first source/drain diffusion region, and having terminals connected to the second bit line and the first source/drain diffusion region, and a second resistive memory element formed below the second bit line above the third source/drain diffusion region, and having terminals connected to the second bit line and the third source/drain diffusion region.

20 Claims, 16 Drawing Sheets

SEMICONDUCTOR MEMORY DEVICE

CROSS-REFERENCE TO RELATED APPLICATIONS

This application is based upon and claims the benefit of priority from prior Japanese Patent Application No. 2007-028384, filed Feb. 7, 2007, the entire contents of which are incorporated herein by reference.

BACKGROUND OF THE INVENTION

1. Field of the Invention

The present invention relates to a semiconductor memory device which uses a resistive memory element as a memory cell and writes information by using an electric current flowing through the resistive memory element and, more particularly, to the structure and arrangement of a memory cell in which paired bit lines connected to the two terminals of the memory cell are formed by the same interconnection layer.

2. Description of the Related Art

Recently, semiconductor memories such as a PRAM (Phase change Random Access Memory) and MRAM (Magnetoresistive Random Access Memory) using resistive elements as memory elements are attracting attention and developed. The former is a semiconductor memory that stores information by changing the resistance value of a resistive memory element by changing the phase of the crystal structure of the element by supplying a write current to it. The latter is a semiconductor memory that uses, as a memory element, a magnetoresistive element having a structure called an MTJ (Magnetic Tunnel Junction) in which two ferromagnetic materials sandwich an insulating film, the magnetization direction in one ferromagnetic layer (a fixed layer) is fixed, and the magnetization direction in the other ferromagnetic layer (a recording layer) is reversible. This semiconductor memory stores information by using a so-called magnetoresistive effect by which the resistance value changes in accordance with relative magnetization directions in the recording layer and fixed layer. In particular, the MRAM has the characteristics that it is nonvolatile, can operate at a high speed, can be highly integrated, and has high reliability. Therefore, the MRAM is expected and developed as a memory device capable of replacing the SRAM, PSRAM (Pseudo SRAM), DRAM, and the like.

Conventionally, a so-called current-induced magnetic field write method is the general write method of the MRAM (e.g., non-patent reference 1). This write method reverses the magnetization direction in the recording layer by a magnetic field induced by an electric current flowing through a write line. On the other hand, this method has the problems that, e.g., the write current is large because the method is an indirect write method, and the write current increases when the MTJ element is downsized because a reversing magnetic field required to cause magnetization reversal in the recording layer increases.

As a method that solves these problems, a so-called spin injection MRAM using magnetization reversal caused by polarized spin current injection is attracting attention and developed (e.g., patent reference 1). In this method, the density of an electric current flowing through a magnetoresistive element defines a current amount (reversing threshold current) necessary for spin injection magnetization reversal. Accordingly, the reversing threshold current reduces as the area of the magnetoresistive element reduces. That is, the method is expected as a technique capable of implementing a large-capacity semiconductor memory, since the reversing threshold current is also scaled.

The write operation of the spin injection MRAM is performed by supplying a write current equal to or larger than the reversing threshold current to the magnetoresistive element, and the direction of the write current flowing through the magnetoresistive element determines the data polarity. In a general 1 Tr+1 MTJ memory cell, for example, one terminal of the MTJ element is connected to a first bit line, the other terminal of the MTJ element is connected to one source/drain electrode of a transistor, and the other source/drain electrode of the transistor is connected to a second bit line. In the conventional device, the first and second bit lines connected to the two terminals of the cell are formed by different interconnection layers. This makes the number of interconnection layers forming the bit lines larger than those of other semiconductor memories such as the DRAM, thereby posing problems such as a high process cost and a long chip formation period.

[Non-patent Reference 1] 2004 Symposium on VLSI Circuits Digest of Technical Papers, pp. 454-457, 2003 IEDM Proceedings, pp. 995-997

[Patent Reference 1] U.S. Pat. No. 5,695,864

BRIEF SUMMARY OF THE INVENTION

A semiconductor memory device according to an aspect of the present invention comprising a first bit line and a second bit line formed by the same interconnection layer, running in the same direction, and adjacent to each other, a first word line and a second word line intersecting the first bit line and the second bit line, and adjacent to each other, a first transistor having a first gate electrode, a first source/drain diffusion region, and a second source/drain diffusion region, the first gate electrode being connected to the first word line, the first source/drain diffusion region and the second source/drain diffusion region being positioned below the second bit line to sandwich the first word line therebetween, and the second source/drain diffusion region being positioned between the first word line and the second word line and connected to the first bit line, a second transistor having the second source/drain diffusion region shared by the first transistor, a second gate electrode, and a third source/drain diffusion region, the second gate electrode being connected to the second word line, and the second source/drain diffusion region and the third source/drain diffusion region being positioned below the second bit line to sandwich the second word line therebetween, a first resistive memory element formed below the second bit line above the first source/drain diffusion region, and having one terminal connected to the second bit line and the other terminal connected to the first source/drain diffusion region, and a second resistive memory element formed below the second bit line above the third source/drain diffusion region, and having one terminal connected to the second bit line and the other terminal connected to the third source/drain diffusion region.

DETAILED DESCRIPTION OF THE INVENTION

Figure 1:
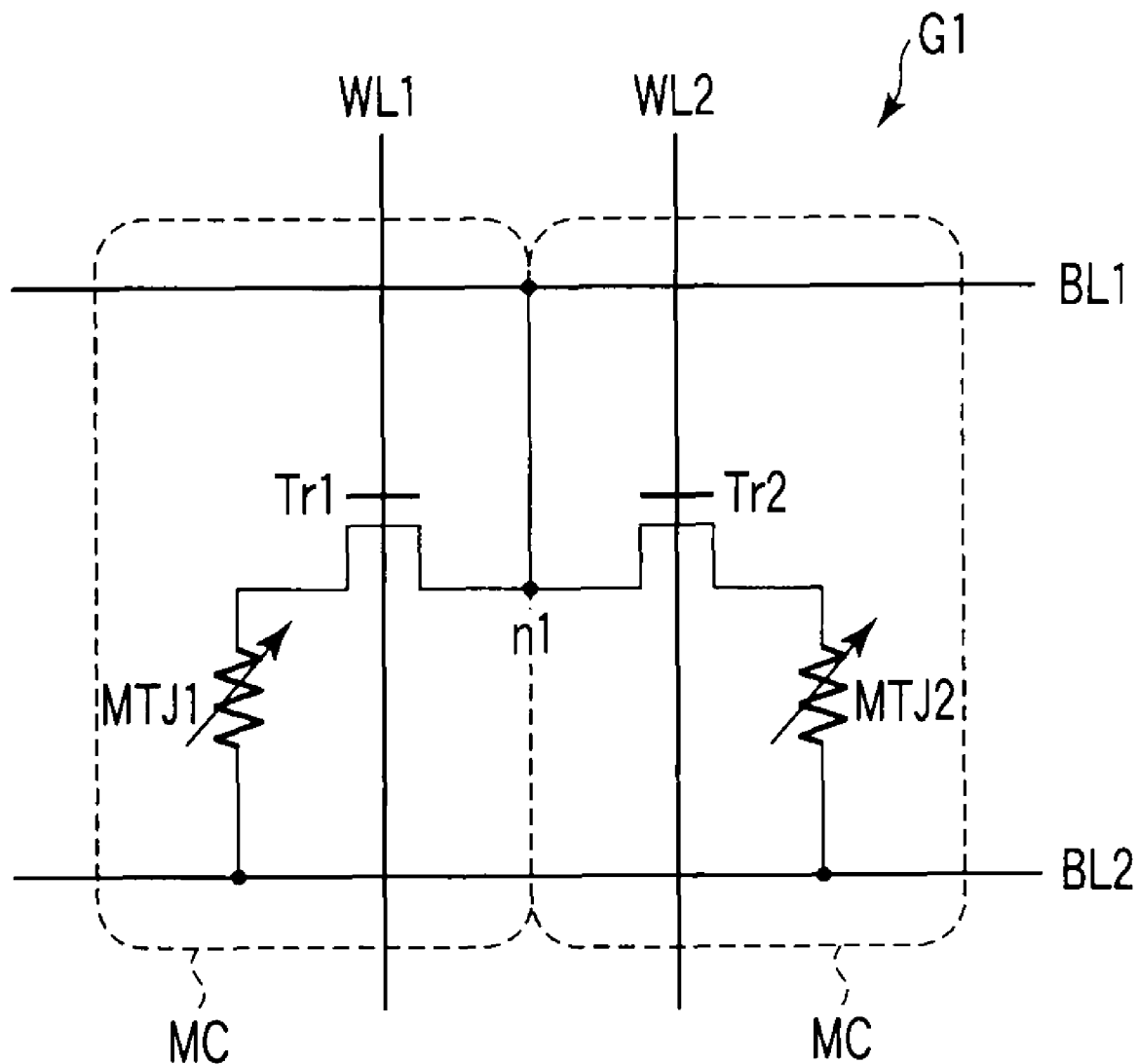
FIG. 1 is an equivalent circuit diagram of one cell group of a magnetic random access memory according to an embodiment of the present invention.

Embodiments of the present invention will be explained below with reference to the accompanying drawing. In the following explanation, the same reference numerals denote the same parts throughout the drawing.

Note that in the following embodiments, a magnetic random access memory will be taken as an example of a semiconductor memory device, and an MTJ element (magnetoresistive effect element) will be used as a resistive memory element.

[1] Circuit Configuration

[1-1] Arrangement of Cell Group

FIG. 1 is an equivalent circuit diagram of a cell group of a magnetic random access memory according to an embodiment of the present invention. The circuit configuration of the cell group of the magnetic random access memory according to the embodiment of the present invention will be explained below.

As shown in FIG. 1, a memory cell MC is a so-called 1 Tr+1 MTJ type memory cell comprising one transistor and one MTJ element. Two adjacent memory cells MC form a cell group G1.

A practical circuit configuration of the cell group G1 is as follows. A first MTJ element MTJ1 has one terminal connected to one end of the current path of a first transistor Tr1, and the other terminal connected a second bit line BL2. The other end of the current path of the first transistor Tr1 is connected to a node n1, and the gate of the first transistor Tr1 is connected to a first word line WL1. A second MTJ element MTJ2 has one terminal connected to one end of the current path of a second transistor Tr2, and the other terminal connected to the second bit line BL2. The other end of the current path of the second transistor Tr2 is connected to the node n1, and the gate of the second transistor Tr2 is connected to a second word line WL2. The node n1 connected to the first and second transistors Tr1 and Tr2 is connected to a first bit line BL1.

[1-2] Type A Memory Cell Array

Figure 2:
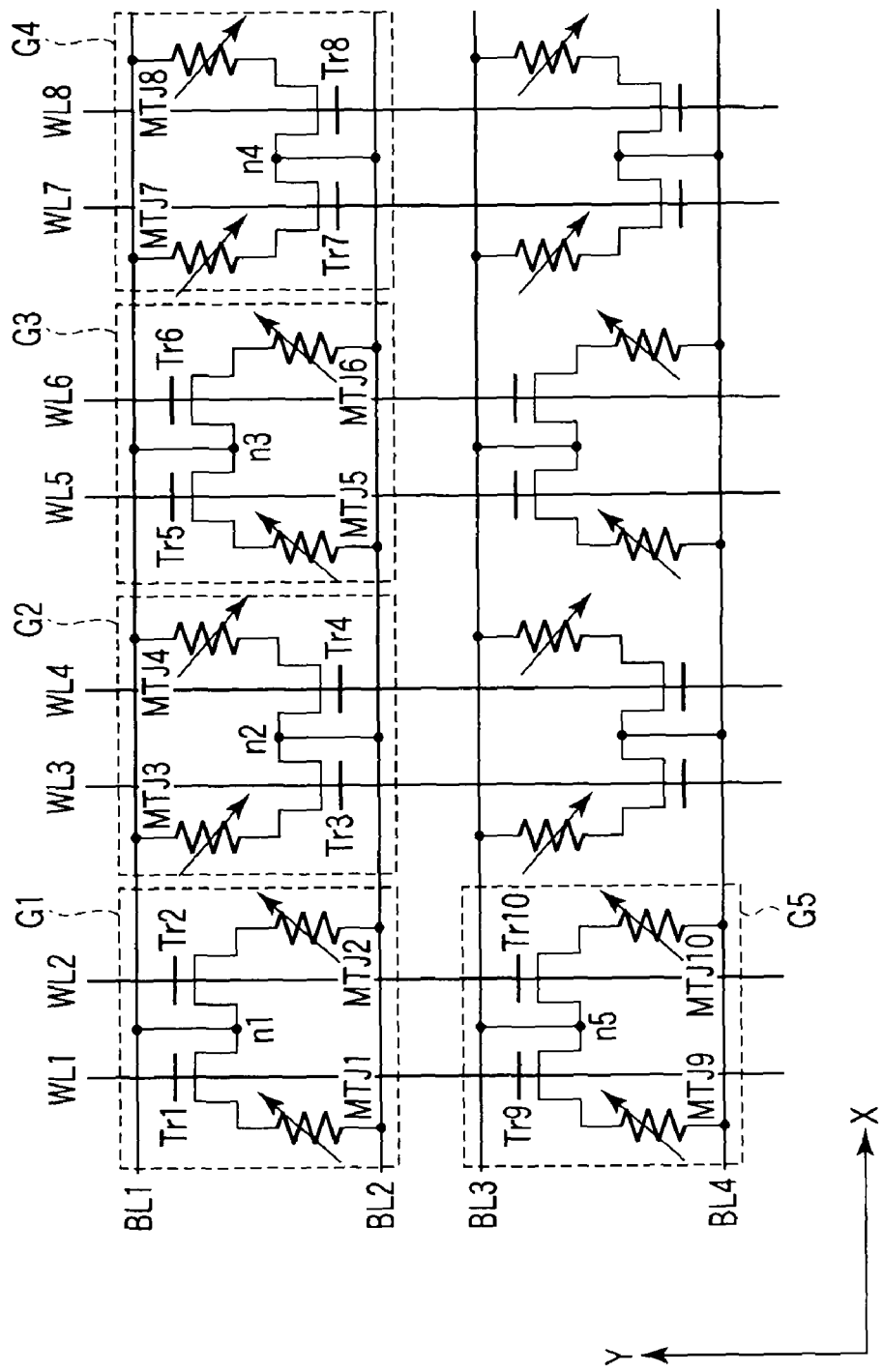
FIG. 2 is an equivalent circuit diagram of a type A memory cell array of the magnetic random access memory according to the embodiment of the present invention.

FIG. 2 is an equivalent circuit diagram of a type A memory cell array of the magnetic random access memory according to the embodiment of the present invention. The circuit configuration of the type A memory cell array of the magnetic random access memory according to the embodiment of the present invention will be explained below. Note that a cell group G1 shown in FIG. 2 is the same as the cell group G1 shown in FIG. 1, so an explanation of the circuit configuration will not be repeated.

In the type A memory cell array as shown in FIG. 2, cell groups adjacent to each other in the X direction have a mirror image relationship, and cell groups adjacent to each other in the Y direction have a translational relationship. The mirror image relationship means a relationship in which adjacent cell groups are axially symmetrical with respect to the direction (X direction) along which the bit line BL runs, or a relationship in which adjacent cell groups are relatively inverted along the Y direction. The translational relationship means a relationship in which adjacent cell groups are translationally symmetrical.

A cell group G2 adjacent to the cell group G1 in the X direction has the following circuit configuration. A third MTJ element MTJ3 has one terminal connected to one end of the current path of a third transistor Tr3, and the other terminal connected to the first bit line BL1. The other end of the current path of the third transistor Tr3 is connected to a node n2, and the gate of the third transistor Tr3 is connected to a third word line WL3. A fourth MTJ element MTJ4 has one terminal connected to one end of the current path of a fourth transistor Tr4, and the other terminal connected to the first bit line BL1. The other end of the current path of the fourth transistor Tr4 is connected to the node n2, and the gate of the fourth transistor Tr4 is connected to a fourth word line WL4. The node n2 connected to the third and fourth transistors Tr3 and Tr4 is connected to the second bit line BL2.

Accordingly, the cell groups G1 and G2 adjacent to each other in the X direction are connected to the pair of bit lines BL1 and BL2, but the connections to the pair of bit lines BL1 and BL2 are opposite to each other. That is, while the common node n1 is connected to the first bit line BL1 in the cell group G1, the common node n2 is connected to the second bit line BL2 in the cell group G2. Thus, the cell groups G1 and G2 adjacent to each other in the X direction have the mirror image relationship.

Note that a cell group G3 adjacent to the cell group G2 has the mirror image relationship with the cell group G2, and has the same arrangement as that of the cell group G1. Note also that a cell group G4 adjacent to the cell group G3 has the mirror image relationship with the cell group G3, and has the same arrangement as that of the cell group G2. In the X direction of the memory cell array, therefore, cell groups having the same arrangement as that of the cell group G1 and cell groups having the same arrangement as that of the cell group G2 are alternately arranged.

A cell group G5 adjacent to the cell group G1 in the Y direction has the following circuit configuration. A ninth MTJ element MTJ9 has one terminal connected to one end of the current path of a ninth transistor Tr9, and the other terminal connected to a fourth bit line BL4. The other end of the current path of the ninth transistor Tr9 is connected to a node n5, and the gate of the ninth transistor Tr9 is connected to the first word line WL1. A 10th MTJ element MTJ10 has one terminal connected to one end of the current path of a 10th transistor Tr10, and the other terminal connected to the fourth bit line BL4.

The other end of the current path of the 10th transistor Tr10 is connected to the node n5, and the gate of the 10th transistor Tr10 is connected to the second word line WL2. The node n5 connected to the ninth and 10th transistors Tr9 and Tr10 is connected to a third bit line BL3.

Accordingly, the cell groups G1 and G5 adjacent to each other in the Y direction share the word lines WL1 and WL2, and the cell group G1 between the pair of bit lines BL1 and BL2 and the cell group G5 between the pair of bit lines BL3 and BL4 are arranged in the same direction. In the Y direction of the memory cell array, therefore, the bit line BL1 connected to the common node n1, the bit line BL2 connected to the MTJ elements MTJ1 and MTJ2, the bit line BL3 connected to the common node n5, and the bit line BL4 connected to the MTJ elements MTJ9 and MTJ10 are arranged in the order named. That is, in the Y direction of the memory cell array, bit lines connected to common nodes and bit lines connected to MTJ elements are alternately arranged. Thus, the cell groups G1 and G5 adjacent to each other in the Y direction have the translational relationship.

[1-3] Type B Memory Cell Array

Figure 3:
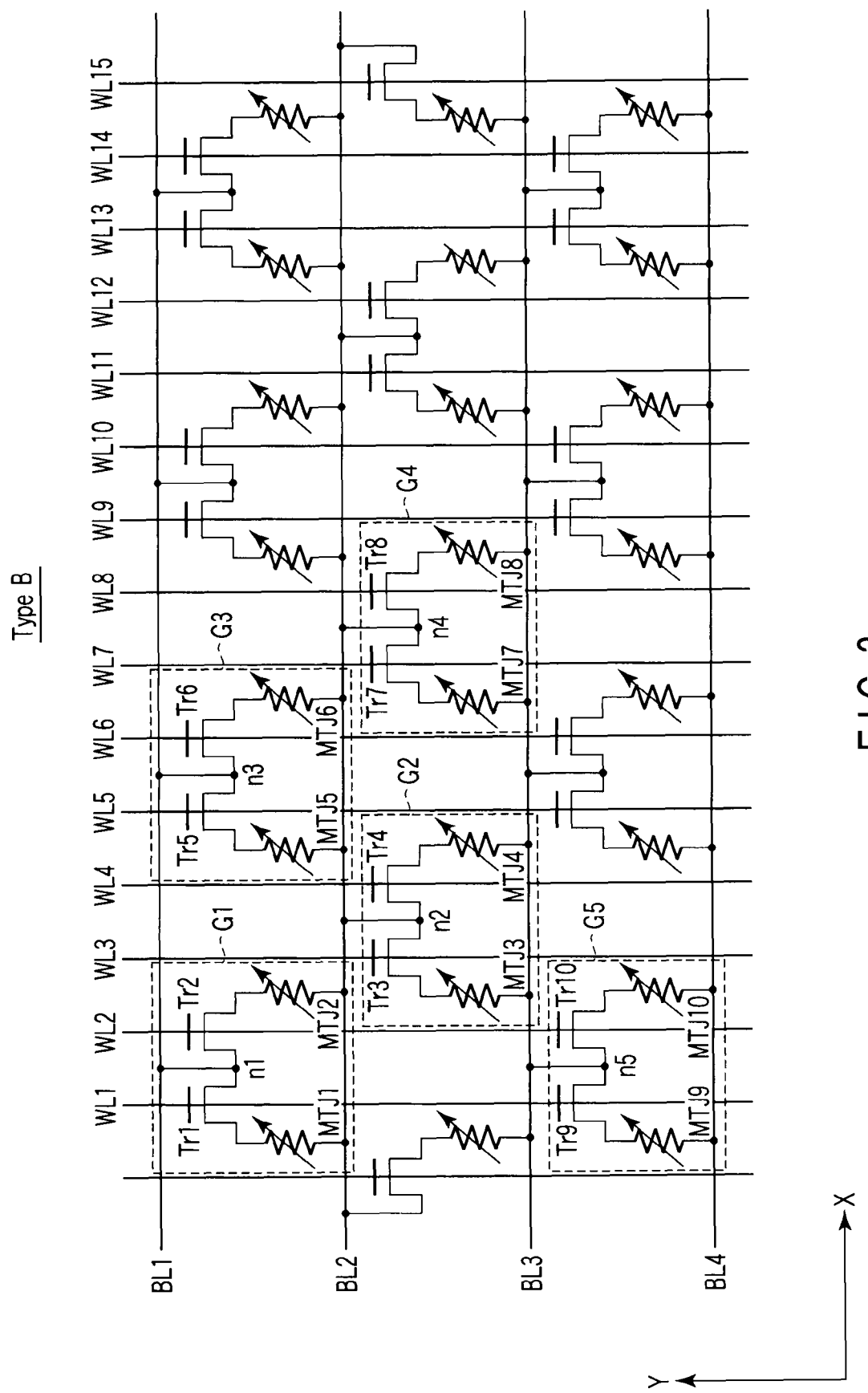
FIG. 3 is an equivalent circuit diagram of a type B memory cell array of the magnetic random access memory according to the embodiment of the present invention.

FIG. 3 is an equivalent circuit diagram of a type B memory cell array of the magnetic random access memory according to the embodiment of the present invention. The circuit configuration of the type B memory cell array of the magnetic random access memory according to the embodiment of the present invention will be explained below. Note that a cell group G1 shown in FIG. 3 is the same as the cell group G1 shown in FIG. 1, so an explanation of the circuit configuration will not be repeated.

In the type B memory cell array as shown in FIG. 3, cell groups adjacent to each other in the X direction, cell groups adjacent to each other in the Y direction, and cell groups obliquely adjacent to each other all have the translational relationship.

A cell group G3 adjacent to the cell group G1 in the X direction has the following circuit configuration. A fifth MTJ element MTJ5 has one terminal connected to one end of the current path of a fifth transistor Tr5, and the other terminal connected to the second bit line BL2. The other end of the current path of the fifth transistor Tr5 is connected to a node n3, and the gate of the fifth transistor Tr5 is connected to a fifth word line WL5. A sixth MTJ element MTJ6 has one terminal connected to one end of the current path of a sixth transistor Tr6, and the other terminal connected to the second bit line BL2. The other end of the current path of the sixth transistor Tr6 is connected to the node n3, and the gate of the sixth transistor Tr6 is connected to a sixth word line WL6. The node n3 connected to the fifth and sixth transistors Tr5 and Tr6 is connected to the first bit line BL1.

Accordingly, the cell groups G1 and G3 adjacent to each other in the X direction are connected to the pair of bit lines BL1 and BL2, and the connections to the pair of bit lines BL1 and BL2 are identical. That is, both the common node n1 in the cell group G1 and the common node n3 in the cell group G3 are connected to the first bit line BL1. Thus, the cell groups G1 and G3 adjacent to each other in the X direction have the translational relationship.

A cell group G5 adjacent to the cell group G1 in the Y direction has the following circuit configuration. A ninth MTJ element MTJ9 has one terminal connected to one end of the current path of a ninth transistor Tr9, and the other terminal connected to a fourth bit line BL4. The other end of the current path of the ninth transistor Tr9 is connected to a node n5, and the gate of the ninth transistor Tr9 is connected to the first word line WL1. A 10th MTJ element MTJ10 has one terminal connected to one end of the current path of a 10th transistor Tr10, and the other terminal connected to the fourth bit line BL4. The other end of the current path of the 10th transistor Tr10 is connected to the node n5, and the gate of the 10th transistor Tr10 is connected to the second word line WL2. The node n5 connected to the ninth and 10th transistors Tr9 and Tr10 is connected to a third bit line BL3.

Accordingly, the cell groups G1 and G5 adjacent to each other in the Y direction share the word lines WL1 and WL2, and the cell group G1 between the pair of bit lines BL1 and BL2 and the cell group G5 between the pair of bit lines BL3 and BL4 are arranged in the same direction. In the Y direction of the memory cell array, therefore, the bit line BL1 connected to the common node n1, the bit line BL2 connected to the MTJ elements MTJ1 and MTJ2, the bit line BL3 connected to the common node n5, and the bit line BL4 connected to the MTJ elements MTJ9 and MTJ10 are arranged in the order named. Thus, the cell groups G1 and G5 adjacent to each other in the Y direction have the translational relationship.

A cell group G2 obliquely adjacent to the cell group G1 has the following circuit configuration. A third MTJ element MTJ3 has one terminal connected to one end of the current path of a third transistor Tr3, and the other terminal connected to the third bit line BL3. The other end of the current path of the third transistor Tr3 is connected to a node n2, and the gate of the third transistor Tr3 is connected to a third word line WL3. A fourth MTJ element MTJ4 has one terminal connected to one end of the current path of a fourth transistor Tr4, and the other terminal connected to the third bit line BL3. The other end of the current path of the fourth transistor Tr4 is connected to the node n2, and the gate of the fourth transistor Tr4 is connected to a fourth word line WL4. The node n2 connected to the third and fourth transistors Tr3 and Tr4 is connected to the second bit line BL2.

Accordingly, the cell groups G1 and G2 obliquely adjacent to each other are connected such that the cell group G1 between the pair of bit lines BL1 and BL2 and the cell group G2 between the pair of bit lines BL2 and BL3 are arranged in the same direction. The cell groups G1 and G2 share the bit line BL2 connected to the MTJ elements MTJ1 and MTJ2 of the cell group G1 and the common node n2 of the cell group G2. Thus, the cell groups G1 and G2 obliquely adjacent to each other have the translational relationship.

Note that the cell groups G1 and G2 or G2 and G3 obliquely adjacent to each other do not share any word line. Therefore, the word lines WL3 and WL4 used in the cell group G2 only run between the cell groups G1 and G3, and are not connected to either the cell group G1 or G3.

2First Embodiment

The first embodiment is an example in which a source/drain diffusion region as a common node of transistors is extracted and connected to an adjacent bit line.

[2-1] Layout

Figure 4:
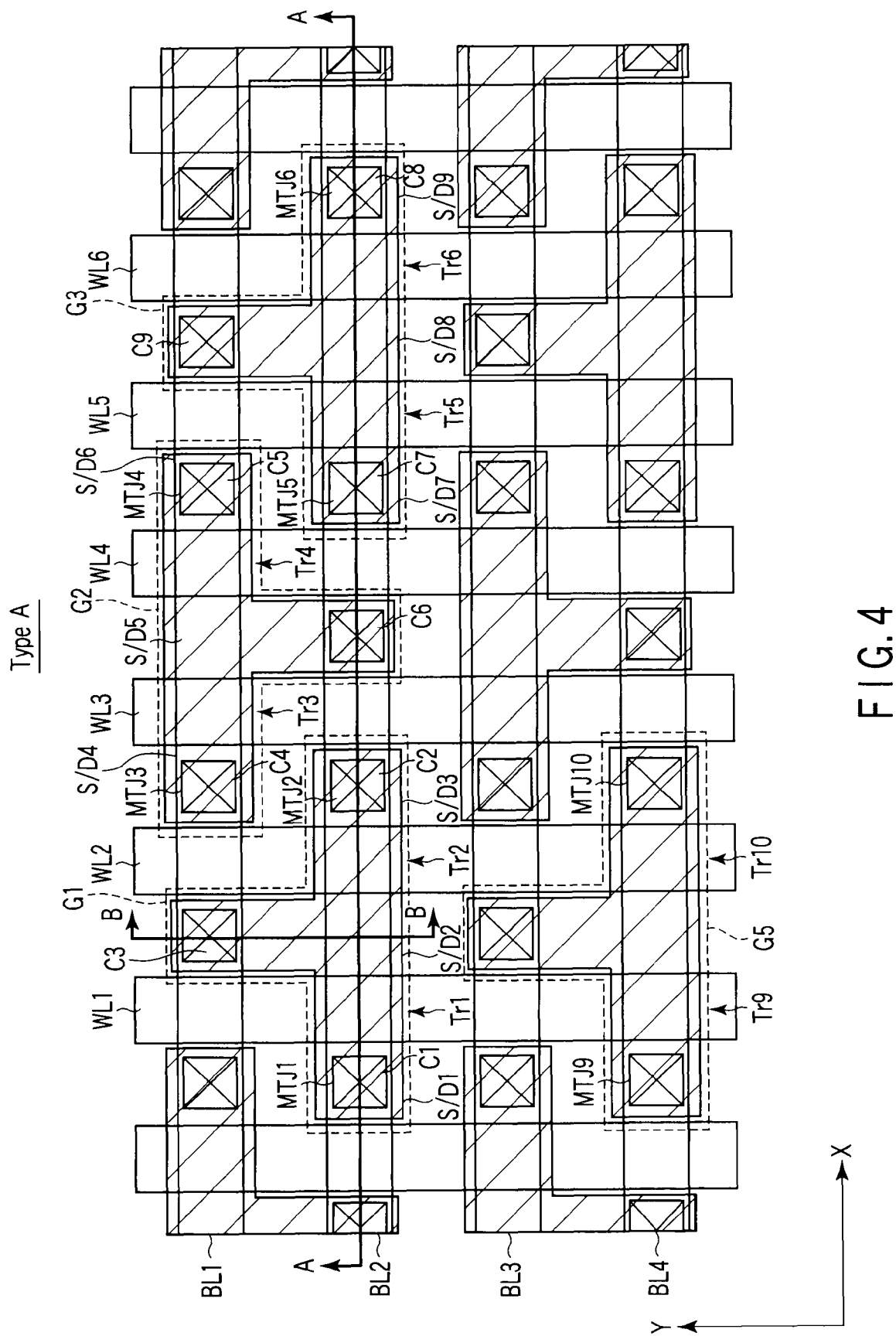
FIG. 4 is a view showing the layout of a type A memory cell array of a magnetic random access memory according to the first embodiment of the present invention.
Figure 5:
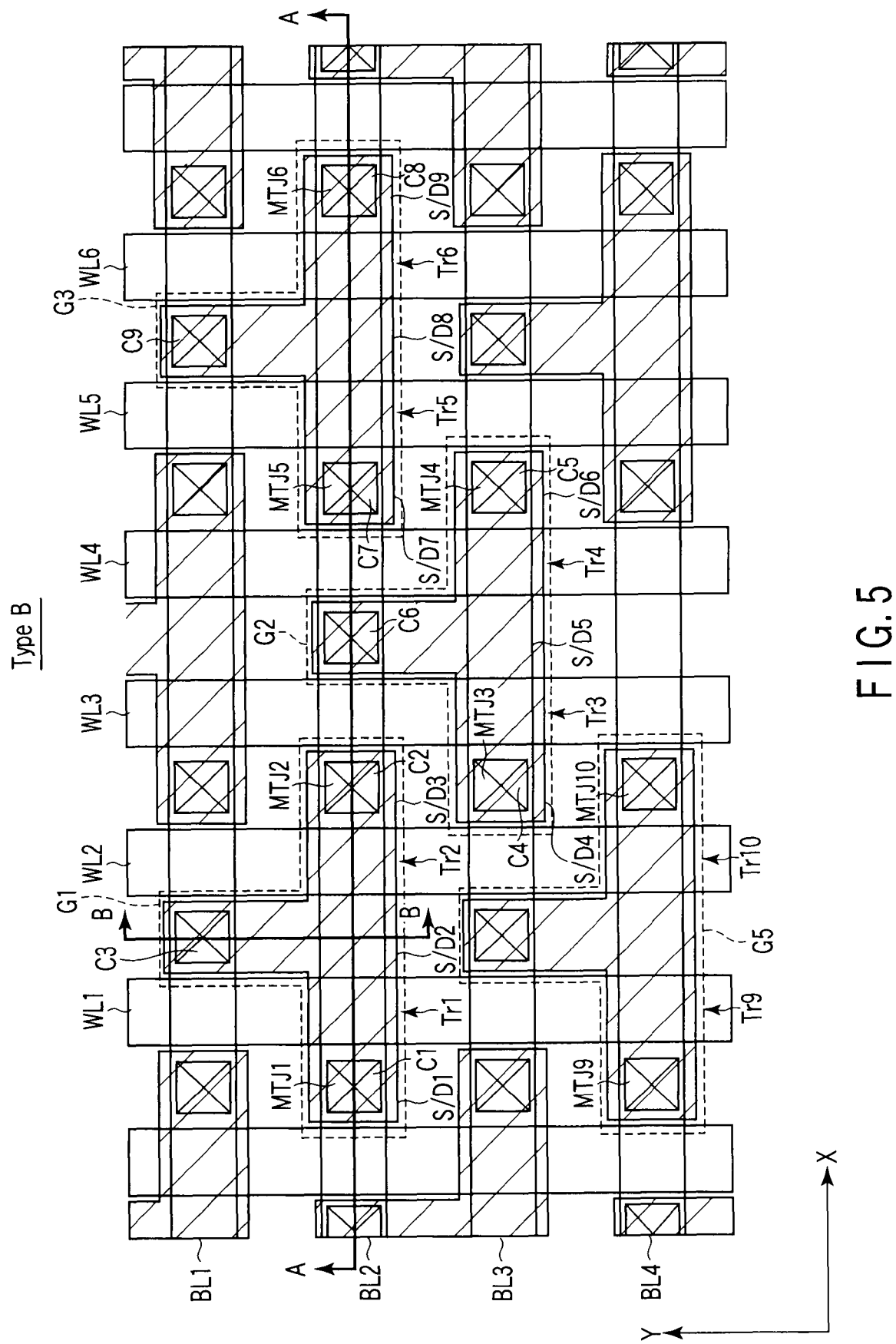
FIG. 5 is a view showing the layout of a type B memory cell array of the magnetic random access memory according to the first embodiment of the present invention.

FIG. 4 is a view showing the layout of a type A memory cell array of a magnetic random access memory according to the first embodiment of the present invention. FIG. 5 is a view showing the layout of a type B memory cell array of the magnetic random access memory according to the first embodiment of the present invention. The layouts of the memory cell arrays according to the first embodiment of the present invention will be explained below by taking a cell group G1 as an example.

As shown in FIGS. 4 and 5, first and second bit lines BL1 and BL2 adjacent to each other are formed by the same interconnection layer, and run in the same direction (in this embodiment, the X direction). First and second word lines WL1 and WL2 adjacent to each other are formed by the first interconnection layer, and run in a direction (in this embodiment, the Y direction) perpendicular to the first and second bit lines BL1 and BL2.

First and second MTJ elements MTJ1 and MTJ2 are formed below the second bit line BL2. The first and second word lines WL1 and WL2 exist between the first and second MTJ elements MTJ1 and MTJ2. Lower electrode layers 14-1 and 14-2 are formed below the first and second MTJ elements MTJ1 and MTJ2.

A first transistor Tr1 is formed below the second bit line BL2. The first transistor Tr1 has a first gate electrode, first source/drain diffusion region S/D1, and second source/drain diffusion region S/D2. The first gate electrode is made of the first word line WL1. The first and second source/drain diffusion regions S/D1 and S/D2 are formed below the second bit line BL2 so as to sandwich the first word line WL1 between them.

A second transistor Tr2 is formed below the second bit line BL2. The second transistor Tr2 has a second gate electrode, the second source/drain diffusion region S/D2, and a third source/drain diffusion region S/D3. The second gate electrode is made of the second word line WL2. The second and third source/drain diffusion regions S/D2 and S/D3 are formed below the second bit line BL2 so as to sandwich the second word line WL3 between them.

The second source/drain diffusion region S/D2 is formed between the first and second word lines WL1 and WL2, and shared by the first and second transistors Tr1 and Tr2. The second source/drain diffusion region S/D2 extends from a portion below the second bit line BL2 to a portion below the first bit line BL1 in the direction (in this embodiment, the Y direction) in which the first and second word lines WL1 and WL2 run.

Accordingly, as indicated by a hatched portion in the drawing, an element region including the first, second, and third source/drain diffusion regions S/D1, S/D2, and S/D3 has a projecting planar shape. This projecting element region has a first portion parallel to the bit lines BL, and a second portion parallel to the word lines WL. The first portion is positioned below the second bit line BL2. The second portion is positioned between the first and second word lines WL1 and WL2.

A contact C1 is formed on the first source/drain diffusion region S/D1. The contact C1 connects the first MTJ element MTJ1 and first source/drain diffusion region S/D1.

A contact C2 is formed on the third source/drain diffusion region S/D3. The contact C2 connects the second MTJ element MTJ2 and third source/drain diffusion region S/D3.

A contact C3 is formed below the first bit line BL1 between the first and second word lines WL1 and WL2. The contact C3 connects the first bit line BL1 and second source/drain diffusion region S/D2.

FIG. 4 shows the layout of the type A memory cell array, and a cell group G2 has the following layout.

Third and fourth word lines WL3 and WL4 adjacent to each other are formed by the same interconnection layer as that of the first and second word lines WL1 and WL2, and run in the direction (in this embodiment, the Y direction) perpendicular to the first and second bit lines BL1 and BL2.

Third and fourth MTJ elements MTJ3 and MTJ4 are formed below the first bit line BL1. The third and fourth word lines WL3 and WL4 exist between the third and fourth MTJ elements MTJ3 and MTJ4. Lower electrode layers 14-3 and 14-4 are formed below the third and fourth MTJ elements MTJ3 and MTJ4.

A third transistor Tr3 is formed below the first bit line BL1. The third transistor Tr3 has a third gate electrode, fourth source/drain diffusion region S/D4, and fifth source/drain diffusion region S/D5. The third gate electrode is made of the third word line WL3. The fourth and fifth source/drain diffusion regions S/D4 and S/D5 are formed below the first bit line BL1 so as to sandwich the third word line WL3 between them.

A fourth transistor Tr4 is formed below the first bit line BL1. The fourth transistor Tr4 has a fourth gate electrode, the fifth source/drain diffusion region S/D5, and a sixth source/drain diffusion region S/D6. The fourth gate electrode is made of the fourth word line WL4. The fifth and sixth source/drain diffusion regions S/D5 and S/D6 are formed below the first bit line BL1 so as to sandwich the fourth word line WL4 between them.

The fifth source/drain diffusion region S/D5 is formed between the third and fourth word lines WL3 and WL4, and shared by the third and fourth transistors Tr3 and Tr4. The fifth source/drain diffusion region S/D5 extends from a portion below the first bit line BL1 to a portion below the second bit line BL2 in the direction (in this embodiment, the Y direction) in which the third and fourth word lines WL3 and WL4 run. As indicated by a hatched portion in FIG. 4, therefore, an element region including the fourth, fifth, and sixth source/drain diffusion regions S/D4, S/D5, and S/D6 has a projecting planar shape.

A contact C4 is formed on the fourth source/drain diffusion region S/D4. The contact C4 connects the third MTJ element MTJ3 and fourth source/drain diffusion region S/D4.

A contact C5 is formed on the sixth source/drain diffusion region S/D6. The contact C5 connects the fourth MTJ element MTJ4 and sixth source/drain diffusion region S/D6.

A contact C6 is formed below the second bit line BL2 between the third and fourth word lines WL3 and WL4. The contact C6 connects the second bit line BL2 and fifth source/drain diffusion region S/D5.

In the above arrangement, the second and third word lines WL2 and WL3 are adjacent to each other. The second and third MTJ elements MTJ2 and MTJ3 and third and fourth source/drain diffusion regions S/D3 and S/D4 are arranged between the second and third word lines WL2 and WL3.

Note that the contact C6 of the cell group G2 is positioned between the MTJ element MTJ2 of the cell group G1 and the MTJ element MTJ5 of the cell group G3.

FIG. 5 shows the layout of the type B memory cell array, and a cell group G2 has the following layout.

A third bit line BL3 adjacent to the second bit line BL2 is formed by the same interconnection layer as that of the first and second bit lines BL1 and BL2, and runs in the same direction (in this embodiment, the X direction) as that of the first and second bit lines BL1 and BL2. Third and fourth word lines WL3 and WL4 adjacent to each other are formed by the same interconnection layer as that of the first and second word lines WL1 and WL2, and run in the direction (in this embodiment, the Y direction) perpendicular to the first and second bit lines BL1 and BL2.

Third and fourth MTJ elements MTJ3 and MTJ4 are formed below the third bit line BL3. The third and fourth word lines WL3 and WL4 exist between the third and fourth MTJ elements MTJ3 and MTJ4. Lower electrode layers 14-3 and 14-4 are formed below the third and fourth MTJ elements MTJ3 and MTJ4.

A third transistor Tr3 is formed below the third bit line BL3. The third transistor Tr3 has a third gate electrode, fourth source/drain diffusion region S/D4, and fifth source/drain diffusion region S/D5. The third gate electrode is made of the third word line WL3. The fourth and fifth source/drain diffusion regions S/D4 and S/D5 are formed below the third bit line BL3 so as to sandwich the third word line WL3 between them.

A fourth transistor Tr4 is formed below the third bit line BL3. The fourth transistor Tr4 has a fourth gate electrode, the fifth source/drain diffusion region S/D5, and a sixth source/drain diffusion region S/D6. The fourth gate electrode is made of the fourth word line WL4. The fifth and sixth source/drain diffusion regions S/D5 and S/D6 are formed below the third bit line BL3 so as to sandwich the fourth word line WL4 between them.

The fifth source/drain diffusion region S/D5 is formed between the third and fourth word lines WL3 and WL4, and shared by the third and fourth transistors Tr3 and Tr4. The fifth source/drain diffusion region S/D5 extends from a portion below the third bit line BL3 to a portion below the second bit line BL2 in the direction (in this embodiment, the Y direction) in which the third and fourth word lines WL3 and WL4 run. As indicated by a hatched portion in FIG. 5, therefore, an element region including the fourth, fifth, and sixth source/drain diffusion regions S/D4, S/D5, and S/D6 has a projecting planar shape.

A contact C4 is formed on the fourth source/drain diffusion region S/D4. The contact C4 connects the third MTJ element MTJ3 and fourth source/drain diffusion region S/D4.

A contact C5 is formed on the sixth source/drain diffusion region S/D6. The contact C5 connects the fourth MTJ element MTJ4 and sixth source/drain diffusion region S/D6.

A contact C6 is formed below the second bit line BL2 between the third and fourth word lines WL3 and WL4. The contact C6 connects the second bit line BL2 and fifth source/drain diffusion region S/D5.

In the above arrangement, the second and third word lines WL2 and WL3 are adjacent to each other. The second and third MTJ elements MTJ2 and MTJ3 and third and fourth source/drain diffusion regions S/D3 and S/D4 are arranged between the second and third word lines WL2 and WL3.

2-2 Sectional Structure Example 1

Figure 6A:
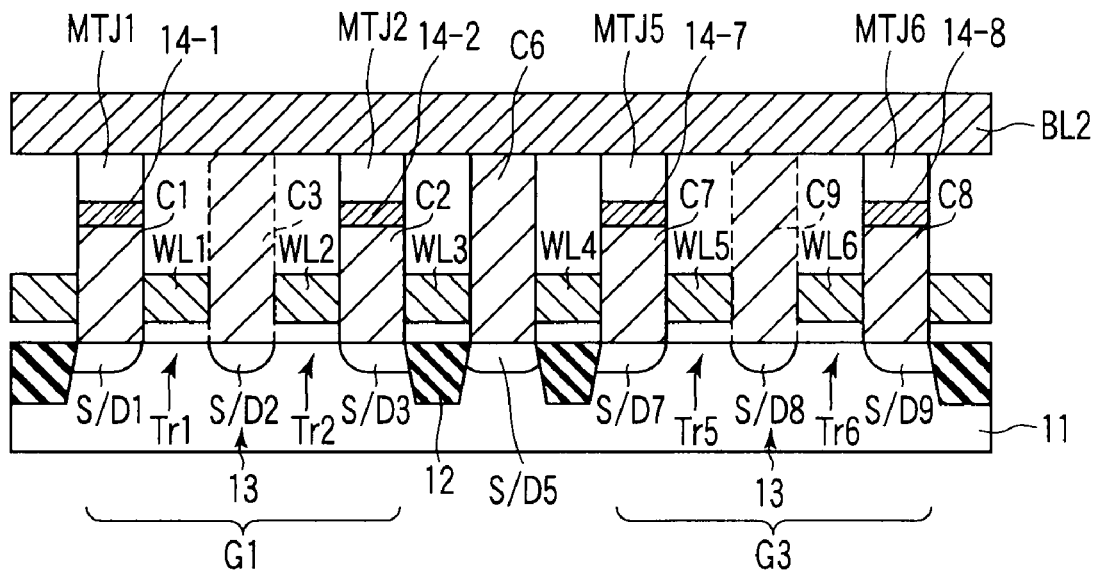
FIG. 6A is a sectional view of sectional structure example 1 taken along a line A-A in FIGS. 4 and 5.

FIG. 6A is a sectional view of sectional structure example 1 taken along a line A-A in FIGS. 4 and 5.

Figure 6B:
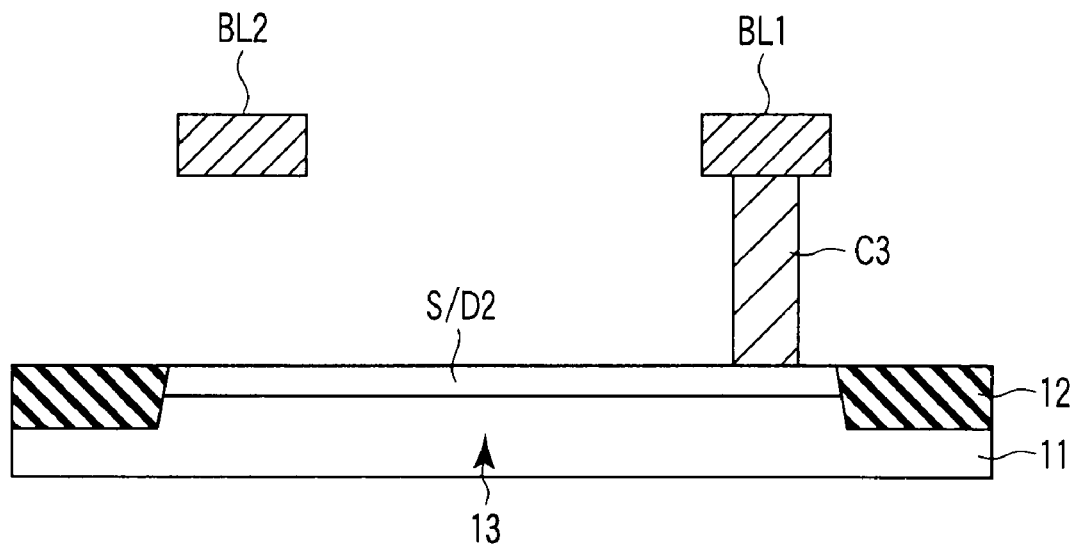
FIG. 6B is a sectional view of sectional structure example 1 taken along a line B-B in FIGS. 4 and 5.

FIG. 6B is a sectional view of sectional structure example 1 taken along a line B-B in FIGS. 4 and 5. Sectional structure example 1 will be explained below by taking the cell group G1 as an example.

As shown in FIG. 6A, an element isolation insulating layer 12 having an STI (Shallow Trench Isolation) structure is formed in a semiconductor substrate 11. Accordingly, the element isolation insulating layer 12 is buried around an element region having a projection planar shape.

The first and second word lines WL1 and WL2 forming the gate electrodes of the first and second transistors Tr1 and Tr2 are formed by the same interconnection layer on the semiconductor substrate 11. The first word line WL1 is positioned between the contacts C1 and C2. The second word line WL2 is positioned between the contacts C2 and C3.

Note that a contact Cn (n=1, 2, 3, . . . ) is electrically insulated from a word line WLn (n=1, 2, 3, . . . )

As shown in FIG. 6B, the first and second bit lines BL1 and BL2 are formed by the same interconnection layer. The second source/drain diffusion region S/D2 shared by the first and second transistors Tr1 and Tr2 extends from a portion below the second bit line BL2 to a portion below the first bit line BL1. The contact C3 positioned below the first bit line BL1 connects the second source/drain diffusion region S/D2 and first bit line BL1.

2-3 Sectional Structure Example 2

Figure 7A:
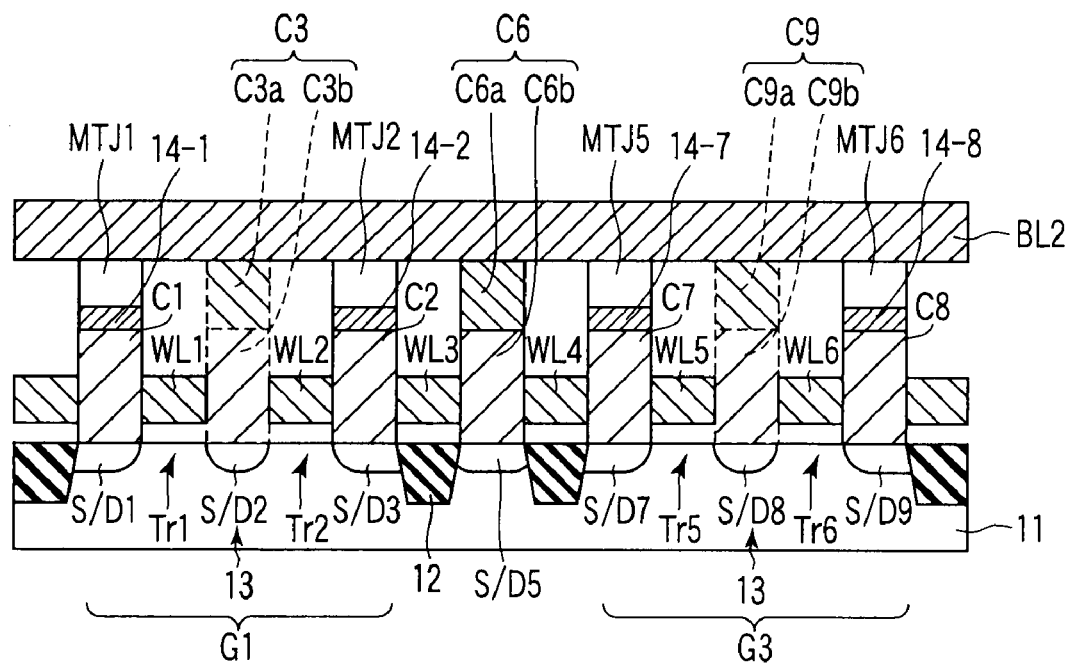
FIG. 7A is a sectional view of sectional structure example 2 taken along the line A-A in FIGS. 4 and 5.
Figure 7B:
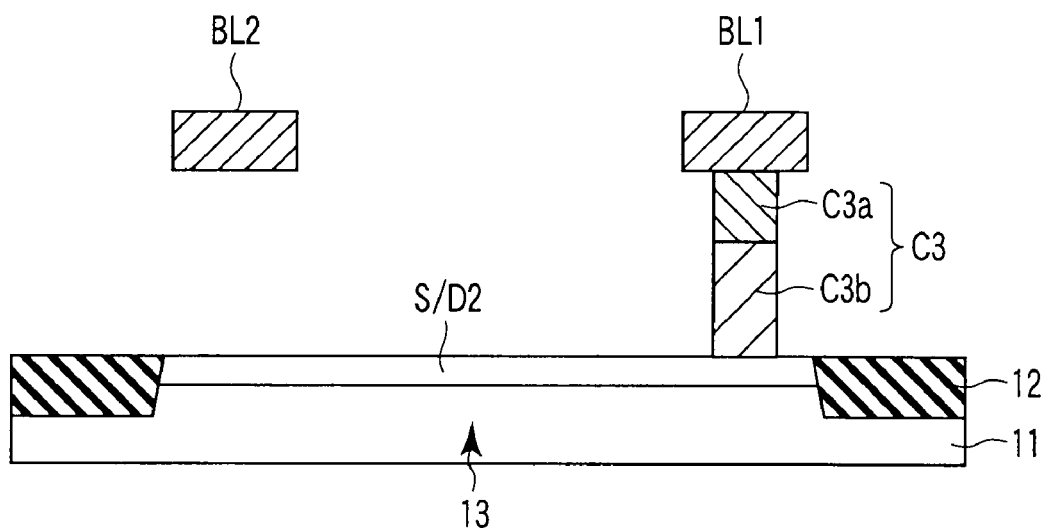
FIG. 7B is a sectional view of sectional structure example 2 taken along the line B-B in FIGS. 4 and 5.
Figure 8A:
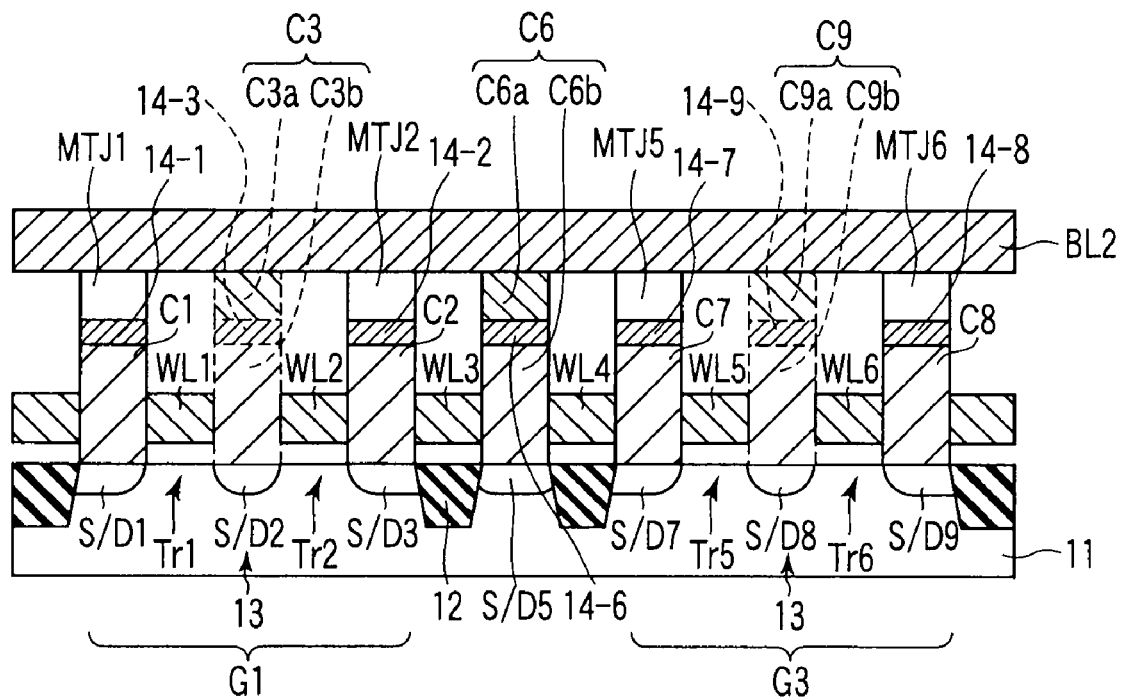
FIG. 8A is a sectional view of sectional structure example 2 taken along the line A-A in FIGS. 4 and 5.
Figure 8B:
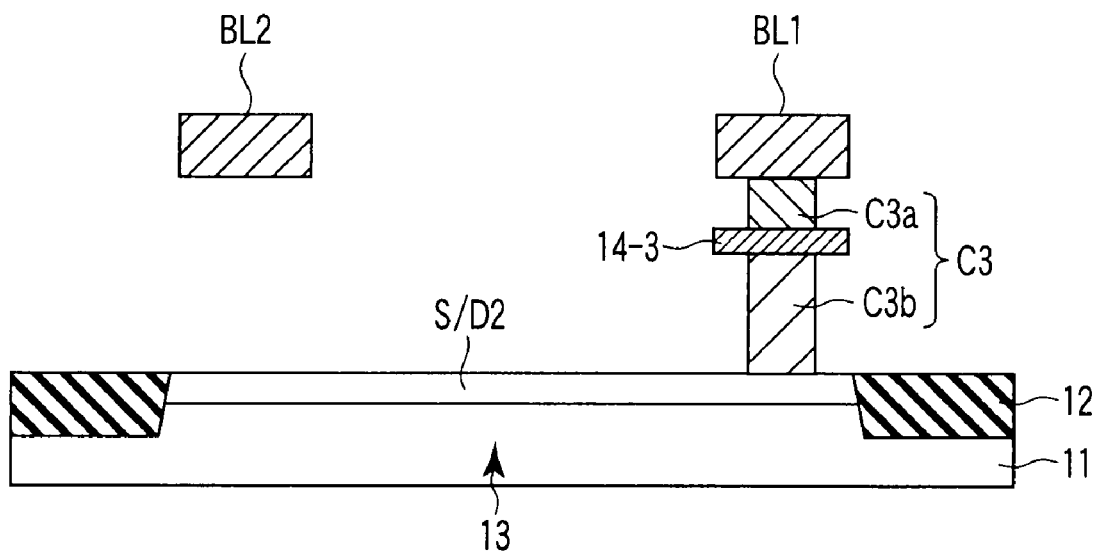
FIG. 8B is a sectional view of sectional structure example 2 taken along the line B-B in FIGS. 4 and 5.

FIGS. 7A and 8A are sectional views of sectional structure example 2 taken along the line A-A in FIGS. 4 and 5. FIGS. 7B and 8B are sectional views of sectional structure example 2 taken along the line B-B in FIGS. 4 and 5. Sectional structure example 2 will be explained below by taking the cell group G1 as an example.

As shown in FIGS. 7A and 7B, sectional structure example 2 differs from sectional structure example 1 in the arrangement of the contact C3. That is, the contact C3 has a double-layered structure including an upper contact portion C3a and lower contact portion C3b. The lower contact portion C3b has the same height as that of the contacts C1 and C2.

Note that as shown in FIGS. 8A and 8B, the lower electrode layer 14-3 of the MTJ element may also be formed between the upper contact portion C3a and lower contact portion C3b.

3 Second Embodiment

The second embodiment is an example in which a common node of transistors and an adjacent bit line are connected by using a lower electrode layer below an MTJ element by extending the lower electrode layer between adjacent bit lines.

Figure 9:
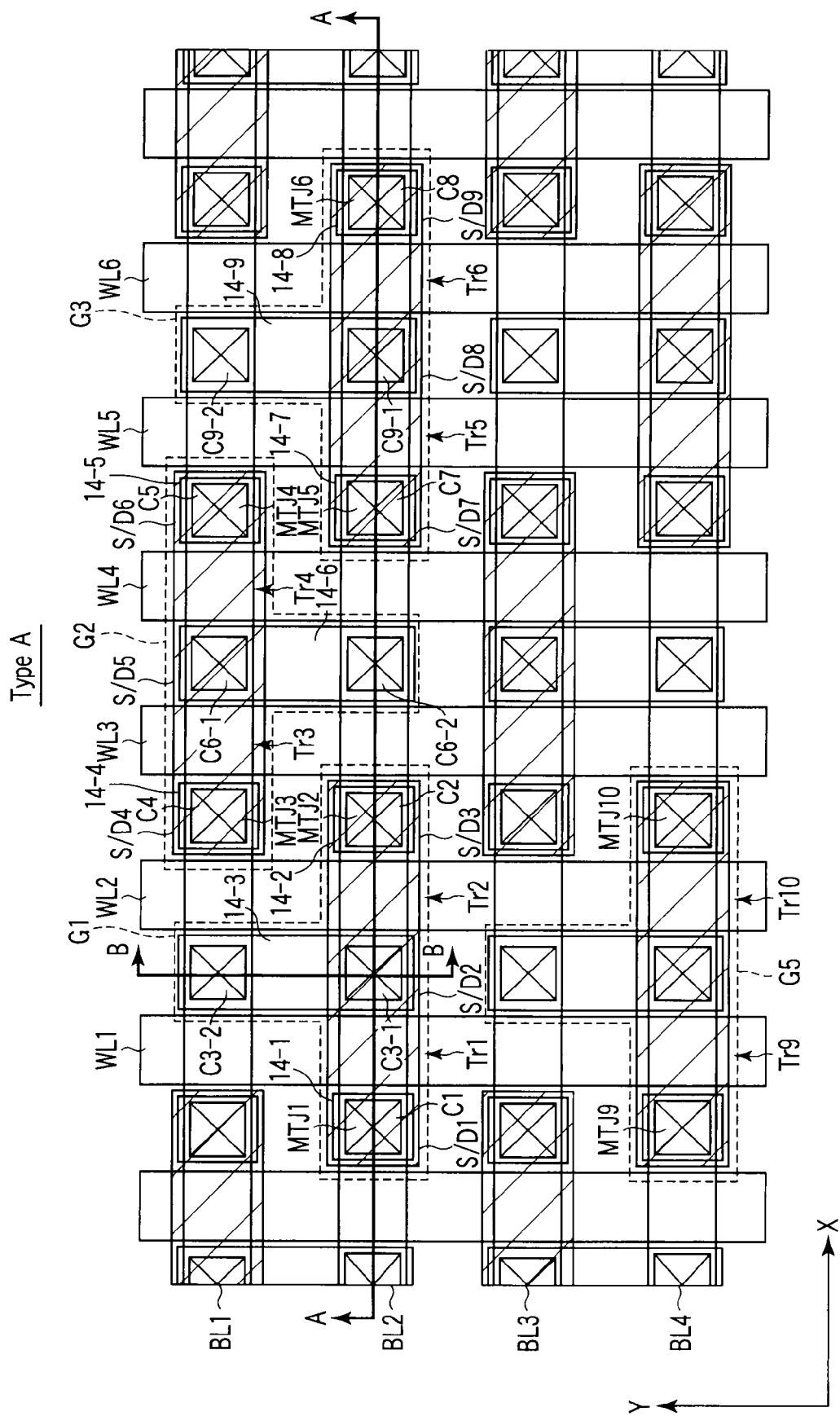
FIG. 9 is a view showing the layout of a type A memory cell array of a magnetic random access memory according to the second embodiment of the present invention.
Figure 10:
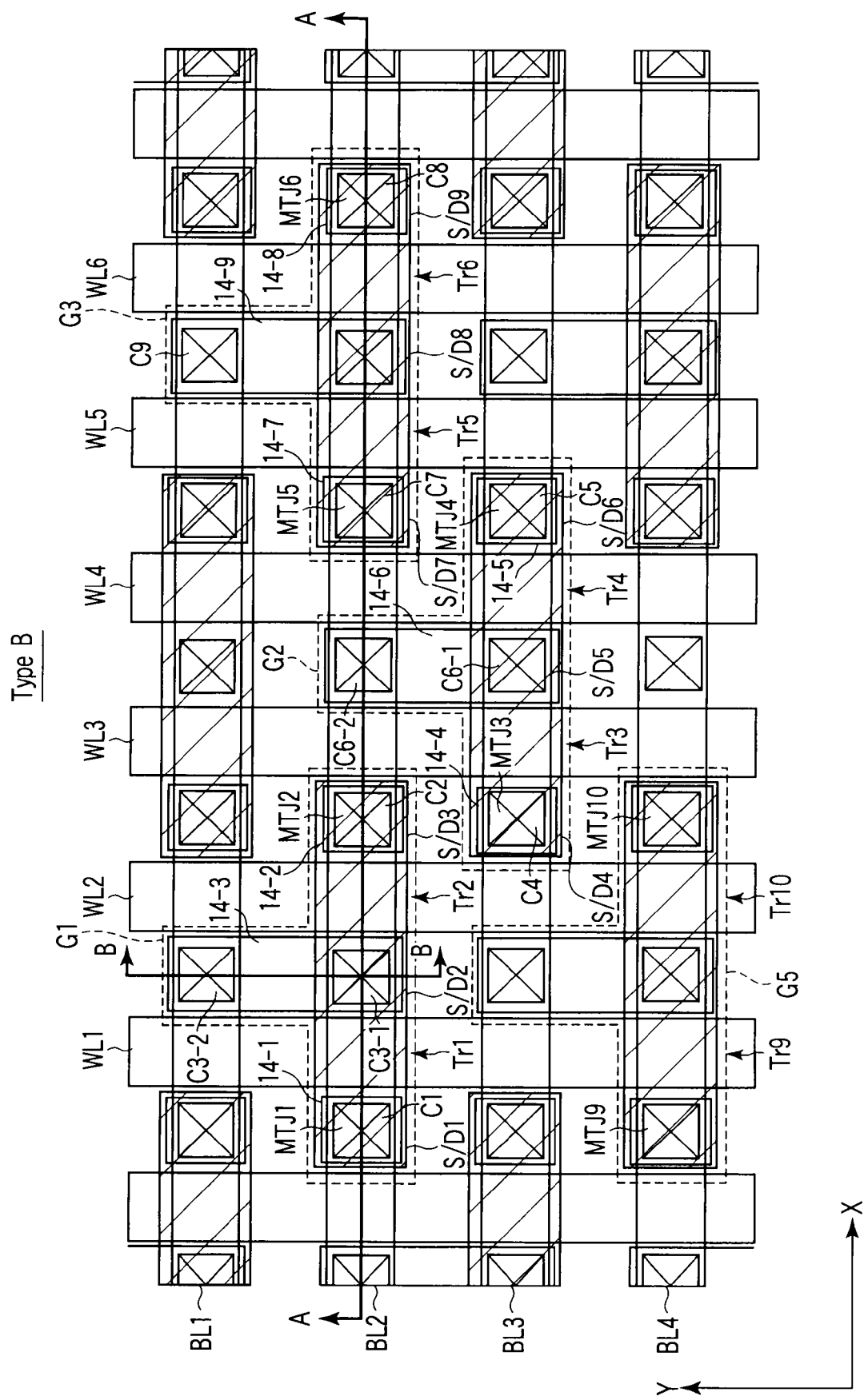
FIG. 10 is a view showing the layout of a type B memory cell array of the magnetic random access memory according to the second embodiment of the present invention.
Figure 11A:
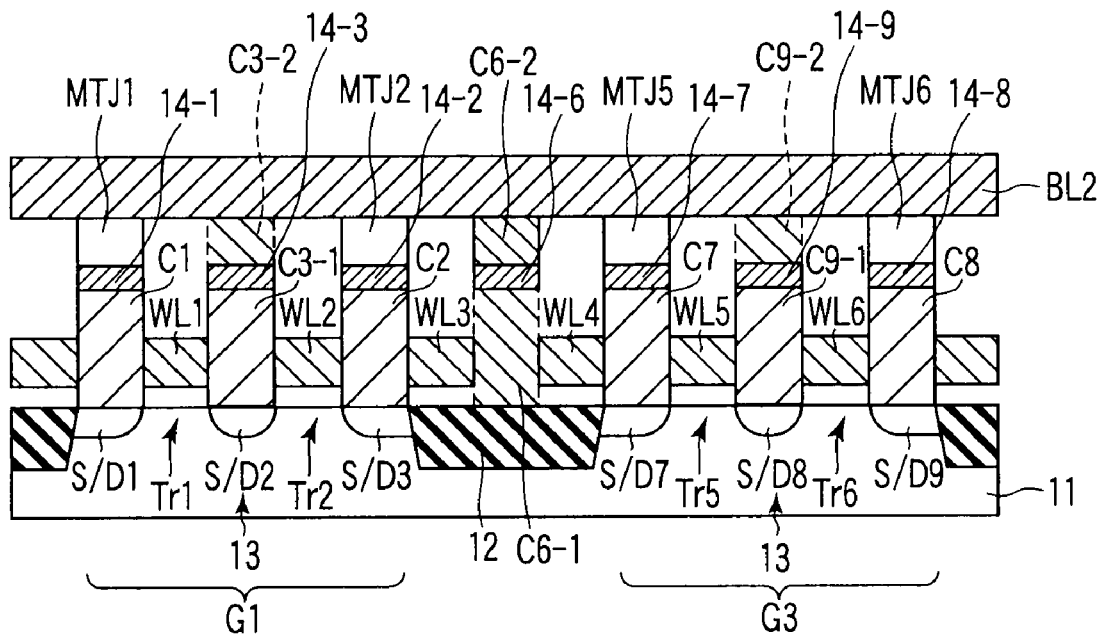
FIG. 11A is a sectional view taken along a line A-A in FIGS. 9 and 10.
Figure 11B:
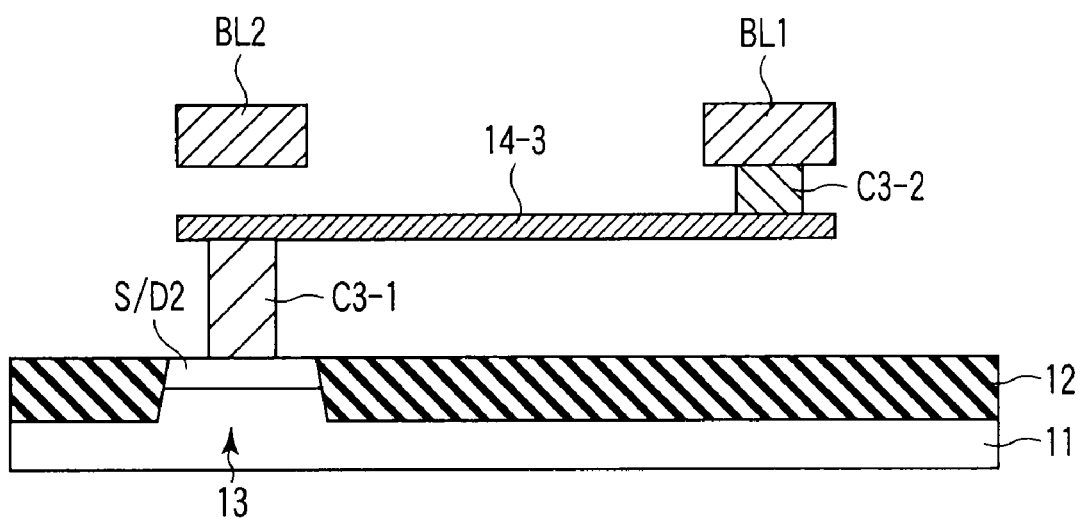
FIG. 11B is a sectional view taken along a line B-B in FIGS. 9 and 10.

FIG. 9 is a view showing the layout of a type A memory cell array of a magnetic random access memory according to the second embodiment of the present invention. FIG. 10 is a view showing the layout of a type B memory cell array of the magnetic random access memory according to the second embodiment of the present invention. FIG. 11A is a sectional view taken along a line A-A in FIGS. 9 and 10. FIG. 11B is a sectional view taken along a line B-B in FIGS. 9 and 10. The layouts and sectional structures of the memory cell arrays according to the second embodiment of the present invention will be explained below by taking a cell group G1 as an example.

As shown in FIGS. 9, 10, 11A, and 11B, the second embodiment differs from the first embodiment in a method of connecting a second source/drain diffusion region S/D2 shared by first and second transistors Tr1 and Tr2 and a first bit line BL1. That is, when connecting the second source/drain diffusion region S/D2 and first bit line BL1, the second source/drain diffusion region S/D2 is extended from a portion below a second bit line BL2 to a portion below the first bit line BL1 in the first embodiment, but a lower electrode layer 14-3 is extended from the portion below the second bit line BL2 to the portion below the first bit line BL1 in the second embodiment.

The second source/drain diffusion region S/D2 exists below only the second bit line BL2 between first and second word lines WL1 and WL2. As indicated by a hatched portion in the drawing, therefore, an element region including a first source/drain diffusion region S/D1, the second source/drain diffusion region S/D2, and a third source/drain diffusion region S/D3 has a rectangular planar shape.

The lower electrode layer 14-3 is formed between the first and second word lines WL1 and WL2 by using the same interconnection layer as that of lower electrode layers 14-1 and 14-2. The lower electrode layer 14-3 is used as an extracted interconnection. The lower electrode layer 14-3 extends from the portion below the second bit line BL2 to the portion below the first bit line BL1 in a direction (in this embodiment, the Y direction) in which the first and second word lines WL1 and WL2 run.

A contact C3-1 is formed below the second bit line BL2 between the first and second word lines WL1 and WL2. The contact C3-1 connects the lower electrode layer 14-3 and second source/drain diffusion region S/D2.

A contact C3-2 is formed below the first bit line BL1 between the first and second word lines WL1 and WL2. The contact C3-2 connects the lower electrode layer 14-3 and first bit line BL1.

4 Third Embodiment

The third embodiment is an example in which a common node of transistors is connected to an interconnection layer, and this interconnection layer is extracted as it is laid on a semiconductor substrate, and connected to an adjacent bit line.

Figure 12:
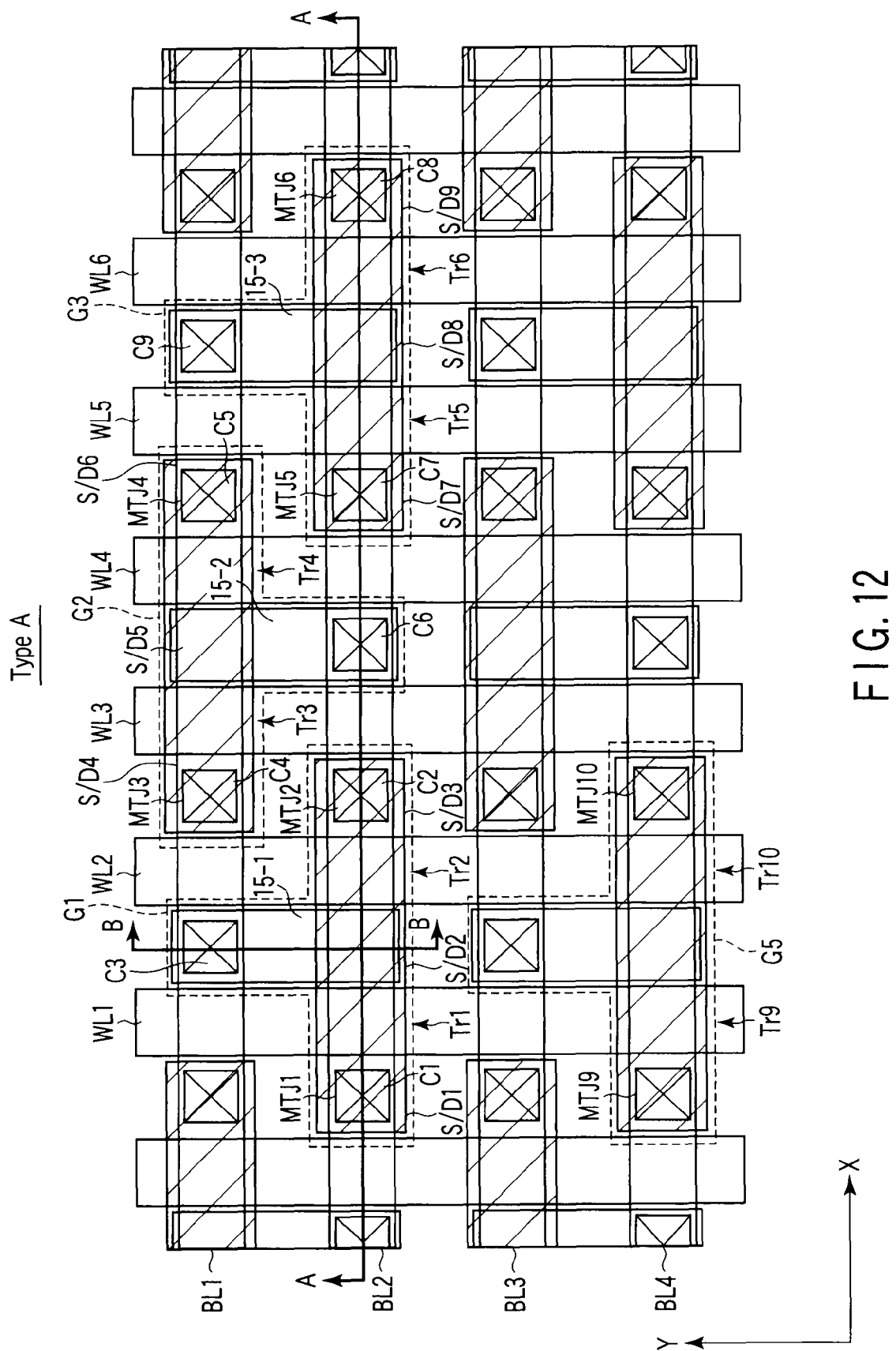
FIG. 12 is a view showing the layout of a type A memory cell array of a magnetic random access memory according to the third embodiment of the present invention.
Figure 13:
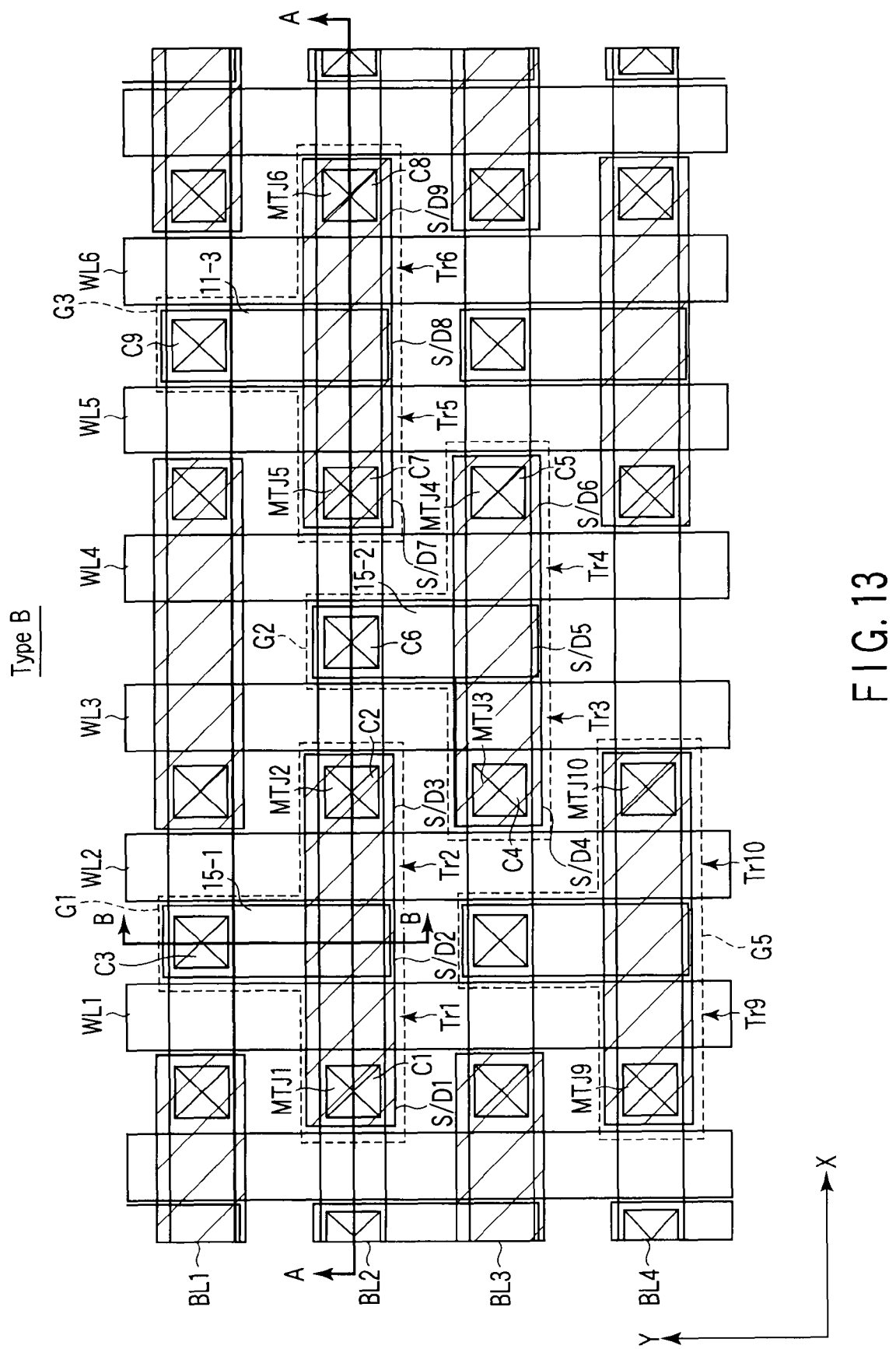
FIG. 13 is a view showing the layout of a type B memory cell array of the magnetic random access memory according to the third embodiment of the present invention.
Figure 14A:
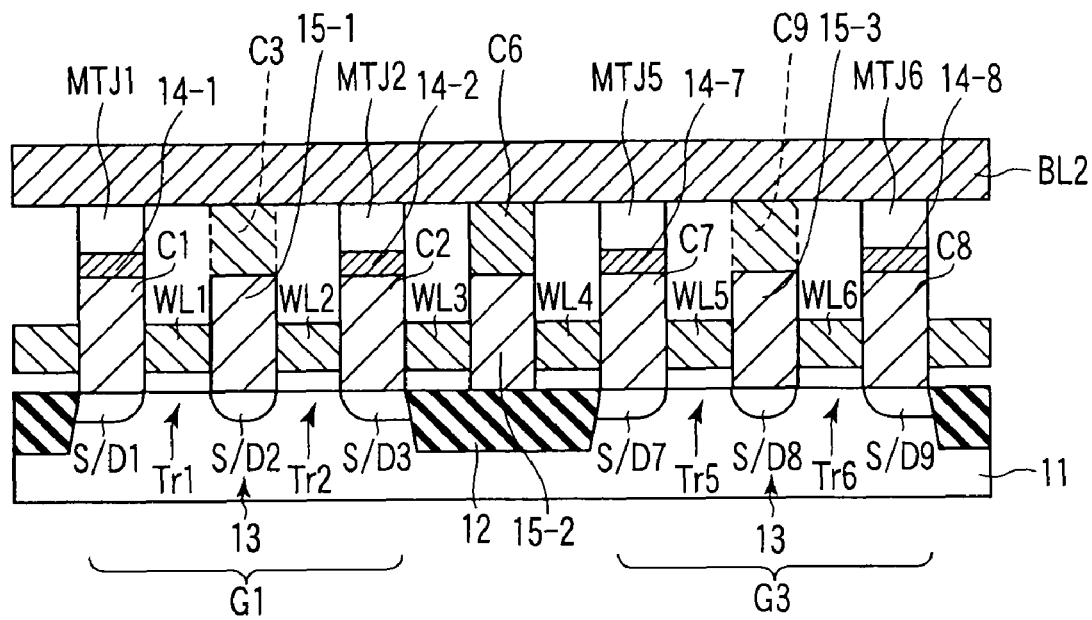
FIG. 14A is a sectional view taken along a line A-A in FIGS. 12 and 13.
Figure 14B:
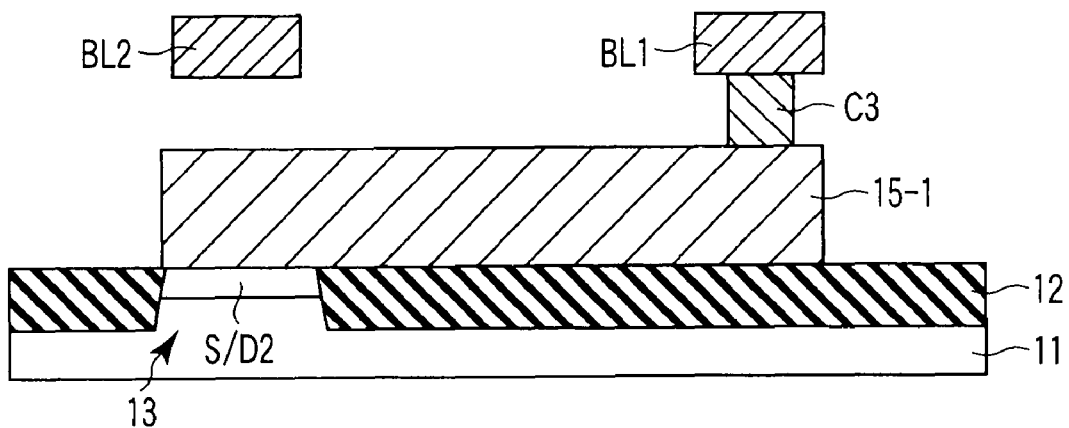
FIG. 14B is a sectional view taken along a line B-B in FIGS. 12 and 13.
Figure 15A:
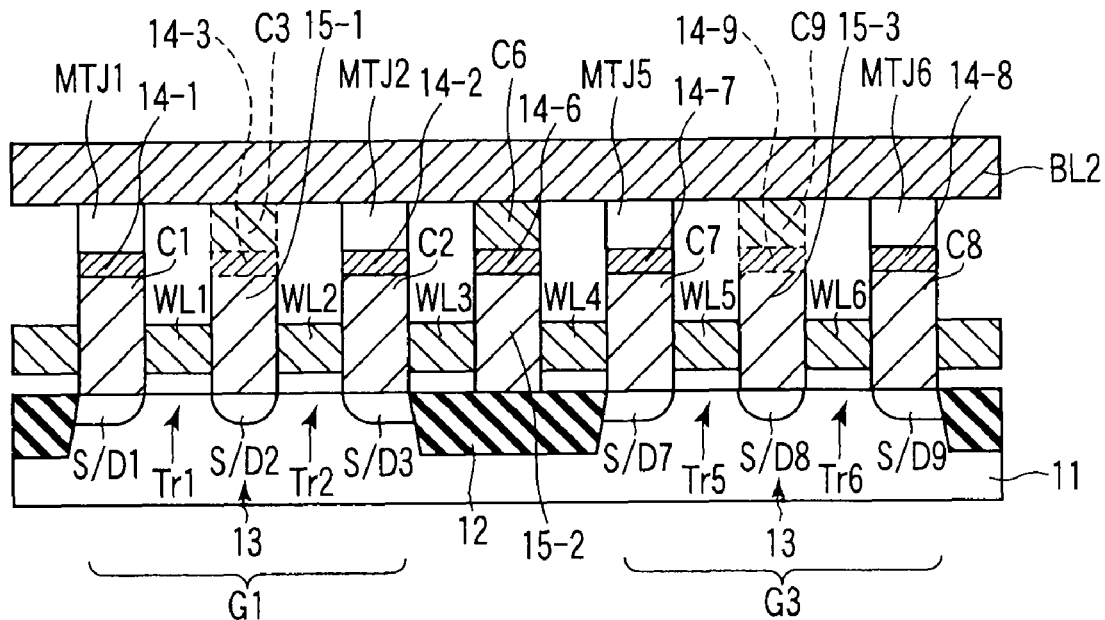
FIG. 15A is a sectional view taken along the line A-A in FIGS. 12 and 13.
Figure 15B:
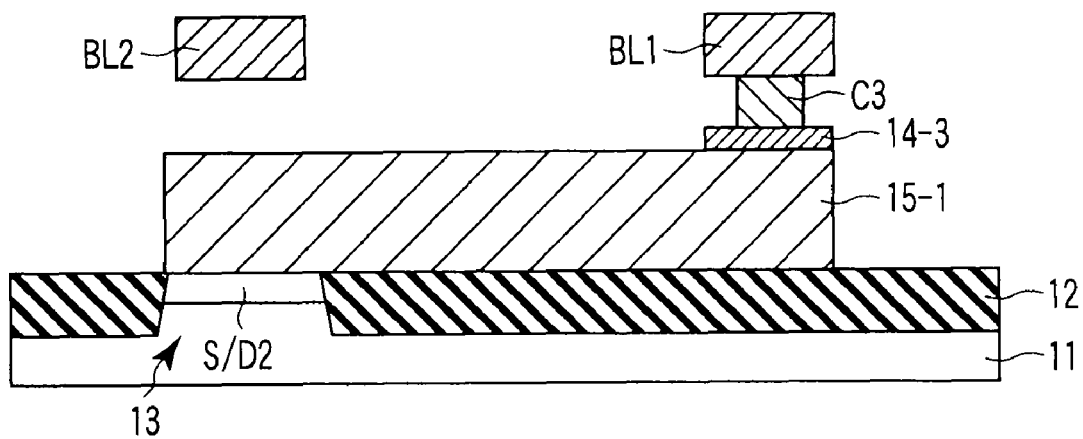
FIG. 15B is a sectional view taken along the line B-B in FIGS. 12 and 13.

FIG. 12 is a view showing the layout of a type A memory cell array of a magnetic random access memory according to the third embodiment of the present invention. FIG. 13 is a view showing the layout of a type B memory cell array of the magnetic random access memory according to the third embodiment of the present invention. FIGS. 14A and 15A are sectional views taken along a line A-A in FIGS. 12 and 13. FIGS. 14B and 15B are sectional views taken along a line B-B in FIGS. 12 and 13. The layouts and sectional structures of the memory cell arrays according to the third embodiment of the present invention will be explained below by taking a cell group G1 as an example.

As shown in FIGS. 12, 13, 14A, and 14B, the third embodiment differs from the first embodiment in a method of connecting a first bit line BL1 and a second source/drain diffusion region S/D2 shared by first and second transistors Tr1 and Tr2. That is, when connecting the second source/drain diffusion region S/D2 and first bit line BL1, the second source/drain diffusion region S/D2 is extracted from a portion below a second bit line BL2 to a portion below the first bit line BL1 in the first embodiment, but an interconnection layer 15-1 laid on a semiconductor substrate is extended from the portion below the second bit line BL2 to the portion below the first bit line BL1 in the third embodiment.

Accordingly, the second source/drain diffusion region S/D2 exists below only the second bit line BL2 between first and second word lines WL1 and WL2. As indicated by a hatched portion in the drawing, therefore, an element region including a first source/drain diffusion region S/D1, the second source/drain diffusion region S/D2, and a third source/drain diffusion region S/D3 has a rectangular planar shape.

The interconnection layer 15-1 made of, e.g., polysilicon is formed between the first and second word lines WL1 and WL2. The interconnection layer 15-1 extends from the portion below the second bit line BL2 to the portion below the first bit line BL1 in a direction (in this embodiment, the Y direction) in which the first and second word lines WL1 and WL2 run. The interconnection layer 15-1 is laid on a semiconductor substrate 11 and on an element isolation insulating layer 12 formed on the semiconductor substrate 11, and in contact with the second source/drain diffusion region S/D2 and element isolation insulating layer 12.

A contact C3 is formed below the first bit line BL1 between the first and second word lines WL1 and WL2. The contact C3 connects the interconnection layer 15-1 and first bit line BL1.

Note that as shown in FIGS. 15A and 15B, a lower electrode layer 14-3 of an MTJ element may also be formed between the contact C3 and interconnection layer 15-1.

5 Fourth Embodiment

In each of the above embodiments, the number of interconnection layers is small because paired bit lines connected to the two terminals of a cell are formed by the same interconnection layer. In the fourth embodiment, therefore, a shunt interconnection of a word line is formed. A shunt interconnection layer L of a word line is applicable to each embodiment.

Figure 16:
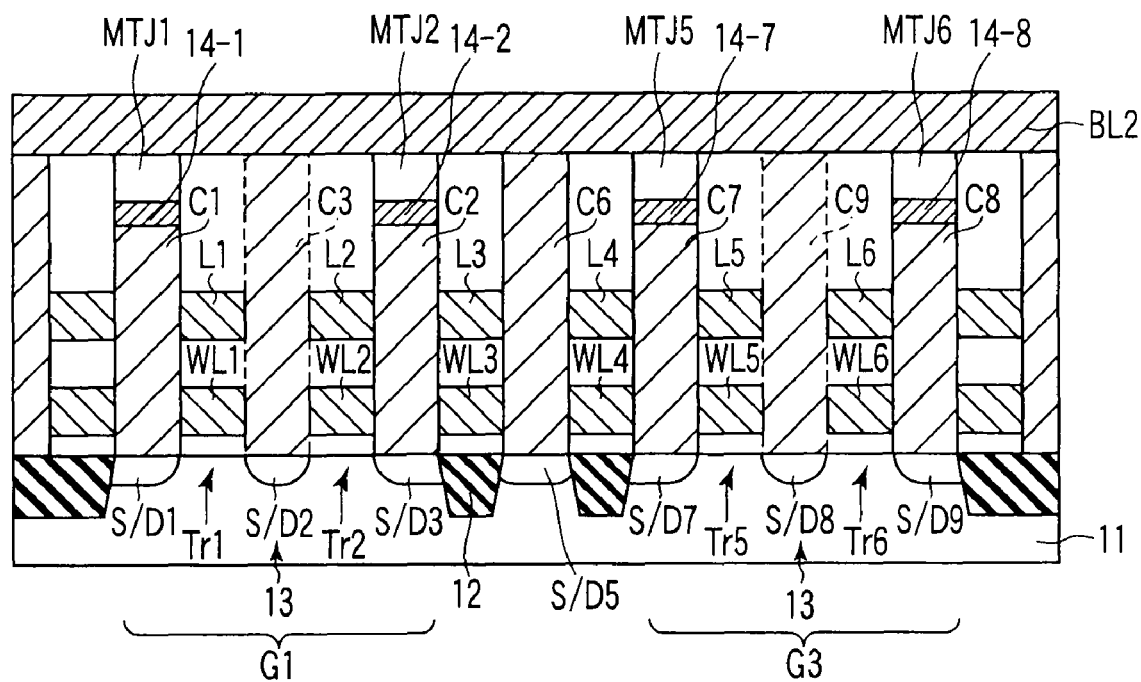
FIG. 16 is a sectional view of a memory cell array of a magnetic random access memory according to the fourth embodiment of the present invention.

FIG. 16 is a sectional view of a memory cell array of a magnetic random access memory according to the fourth embodiment of the present invention. The sectional structure of the memory cell array according to the fourth embodiment of the present invention will be explained below by taking a cell group G1 as an example.

As shown in FIG. 16, the fourth embodiment differs from the first embodiment in that interconnection layers L1 and L2 are formed below bit lines BL1 and BL2.

The interconnection layer L1 is formed between a word line WL1 and the bit lines BL1 and BL2. The interconnection layer L2 is formed between a word line WL2 and the bit lines BL1 and BL2. The interconnection layers L1 and L2 extend in the same direction (in this embodiment, the Y direction) as that of the word lines WL1 and WL2. The interconnection layers L1 and L2 are connected to the word lines WL1 and WL2 in a predetermined region of the memory cell array (e.g., at the shunt region of the memory cell array). This makes it possible to reduce the interconnection resistance of the word line, and implement a high-speed operation of the word line.

Note that a contact Cn (n=1, 2, 3, . . . ) is electrically insulated from an interconnection layer Ln (n=1, 2, 3, . . . )

[6] MTJ Element

The MTJ element described above includes a fixed layer (pinned layer) in which the magnetization direction is fixed, a recording layer (free layer) in which the magnetization direction is reversible, and a nonmagnetic layer (e.g., an insulating layer) formed between the fixed layer and recording layer.

The MTJ element can have a single-junction structure having one nonmagnetic layer, or a double-junction structure having two nonmagnetic layers. An MTJ element having this double-junction structure comprises a first fixed layer, a second fixed layer, a recording layer formed between the first and second fixed layers, a first nonmagnetic layer formed between the first fixed layer and recording layer, and a second nonmagnetic layer formed between the second fixed layer and recording layer.

The planar shape of the MTJ element is not limited to a square shown in the drawing. For example, the planar shape of the MTJ element can be variously changed to a rectangle, ellipse, circle, hexagon, rhombus, parallelogram, cross, or bean (recessed shape).

The MTJ element can be a perpendicular magnetization type element in which the magnetization directions in the fixed layer and recording layer are perpendicular to the film surface, or a parallel magnetization type element in which they are parallel to the film surface.

[7] Write and Read Methods

The write method uses the spin injection magnetization reversing technique as described in U.S. Pat. No. 5,695,864 (patent reference 1). Spin injection magnetization reversal is performed by injecting, into the recording layer, electrons (spin-polarized electrons) spin-polarized by the magnetic moment in the fixed layer, and reversing magnetization in the recording layer by the movement of the spin angular momentum caused by the exchange interaction between the spin-polarized electrons and electrons in the recording layer.

That is, when a write current flows from the fixed layer to the recording layer (when the spin-polarized electrons flow from the recording layer to the fixed layer), the magnetization directions in the recording layer and fixed layer become antiparallel, and data "1" is written. On the other hand, when the write current flows from the recording layer to the fixed layer (when the spin-polarized electrons flow from the fixed layer to the recording layer), the magnetization directions in the recording layer and fixed layer become parallel, and data "0" is written.

As described above, a write current equal to or larger than a magnetization reversing threshold current is supplied by the application of a potential difference to the two terminals of the MTJ element, thereby reversing the magnetization direction in the recording layer. Data "1" or "0" is written by changing the resistance value of the MTJ element by making the magnetization directions in the fixed layer and recording layer parallel or antiparallel in accordance with the direction of the write current.

The read method uses the tunneling magnetoresistive effect. The tunneling magnetoresistive effect is a phenomenon in which the magnitude of a tunneling current changes in accordance with whether the magnetization directions in the fixed layer and recording layer of the MTJ element are parallel or antiparallel. When the magnetization directions are parallel, the resistance value of the MTJ element decreases because the tunneling current increases. When the magnetization directions are antiparallel, the resistance value of the MTJ element increases because the tunneling current decreases. In the magnetic random access memory, therefore, the case where the resistance value of the MTJ element is low is defined as, e.g., data "0", and the case where the resistance value is high is defined as, e.g., data "1". The resistance value of the MTJ element is read out by supplying a read current to the MTJ element, and whether the data is "1" or "0" is discriminated.

[8] Effects

Conventionally, paired bit lines connected to the two terminals of the memory cell MC are formed by different interconnection layers. Therefore, at least two interconnection layers are necessary to form the memory cell MC except for an interconnection layer for the gate electrode. By contrast, in the embodiment of the present invention, paired bit lines connected to the two terminals of the memory cell MC are formed by the same interconnection layer. Since only one interconnection layer is necessary except for an interconnection layer for the gate electrode, therefore, one interconnection layer can be reduced compared to the conventional device. This makes it possible to reduce the process cost and shorten the chip formation period without increasing the memory cell area. The cell size in the embodiment of the present invention as described above is $8F^2$ (F is a minimum feature size).

In addition, the present invention is not limited to the above embodiments and can be variously modified when practiced without departing from the spirit and scope of the invention. For example, the present invention is also applicable to a PRAM (Phase change Random Access Memory) by using another resistive memory element, such as a memory element using a crystal phase change, instead of the magnetoresistive element (MTJ element).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a first bit line and a second bit line formed by the same interconnection layer, running in the same direction, and adjacent to each other;
   a first word line and a second word line intersecting the first bit line and the second bit line, and adjacent to each other;
   a first transistor having a first gate electrode, a first source/drain diffusion region, and a second source/drain diffusion region, the first gate electrode being connected to the first word line, the first source/drain diffusion region and the second source/drain diffusion region being positioned below the second bit line to sandwich the first word line therebetween, and the second source/drain diffusion region being positioned between the first word line and the second word line and connected to the first bit line;
   a second transistor having the second source/drain diffusion region shared by the first transistor, a second gate electrode, and a third source/drain diffusion region, the second gate electrode being connected to the second word line, and the second source/drain diffusion region and the third source/drain diffusion region being positioned below the second bit line to sandwich the second word line therebetween;
   a first resistive memory element formed below the second bit line above the first source/drain diffusion region, and having one terminal connected to the second bit line and the other terminal connected to the first source/drain diffusion region; and
   a second resistive memory element formed below the second bit line above the third source/drain diffusion region, and having one terminal connected to the second bit line and the other terminal connected to the third source/drain diffusion region.

2. The device according to claim 1, further comprising:
a third word line and a fourth word line intersecting the first bit line and the second bit line, and adjacent to each other;
a third transistor having a third gate electrode, a fourth source/drain diffusion region, and a fifth source/drain diffusion region, the third gate electrode being connected to the third word line, the fourth source/drain diffusion region and the fifth source/drain diffusion region being positioned below the first bit line to sandwich the third word line therebetween, and the fifth source/drain diffusion region being positioned between the third word line and the fourth word line and connected to the second bit line;
a fourth transistor having the fifth source/drain diffusion region shared by the third transistor, a fourth gate electrode, and a sixth source/drain diffusion region, the fourth gate electrode being connected to the fourth word line, and the fifth source/drain diffusion region and the sixth source/drain diffusion region being positioned below the first bit line to sandwich the fourth word line therebetween;
a third resistive memory element formed below the first bit line above the fourth source/drain diffusion region, and having one terminal connected to the first bit line and the other terminal connected to the fourth source/drain diffusion region; and
a fourth resistive memory element formed below the first bit line above the sixth source/drain diffusion region, and having one terminal connected to the first bit line and the other terminal connected to the sixth source/drain diffusion region.

3. The device according to claim 2, wherein
the second word line and the third word line are adjacent to each other, and
the second resistive effect element, the third resistive effect element, the third source/drain diffusion region, and the fourth source/drain diffusion region are arranged between the second word line and the third word line.

4. The device according to claim 3, wherein the second resistive effect element and the third resistive effect element are arranged in a direction in which the first word line and the second word line run.

5. The device according to claim 3, further comprising a contact formed below the second bit line between the third word line and the fourth word line, and connected to the second bit line and the fifth source/drain diffusion region.

6. The device according to claim 1, further comprising:
a third bit line formed by the same interconnection layer as that of the first bit line and the second bit line, running in the same direction as that of the first bit line and the second bit line, and adjacent to the second bit line;
a third word line and a fourth word line intersecting the first bit line, the second bit line, and the third bit line, and adjacent to each other;
a third transistor having a third gate electrode, a fourth source/drain diffusion region, and a fifth source/drain diffusion region, the third gate electrode being connected to the third word line, the fourth source/drain diffusion region and the fifth source/drain diffusion region being positioned below the third bit line to sandwich the third word line therebetween, and the fifth source/drain diffusion region being positioned between the third word line and the fourth word line and connected to the second bit line;
a fourth transistor having the fifth source/drain diffusion region shared by the third transistor, a fourth gate electrode, and a sixth source/drain diffusion region, the fourth gate electrode being connected to the fourth word line, and the fifth source/drain diffusion region and the sixth source/drain diffusion region being positioned below the third bit line to sandwich the fourth word line therebetween;
a third resistive memory element formed below the third bit line above the fourth source/drain diffusion region, and having one terminal connected to the third bit line and the other terminal connected to the fourth source/drain diffusion region; and
a fourth resistive memory element formed below the third bit line above the sixth source/drain diffusion region, and having one terminal connected to the third bit line and the other terminal connected to the sixth source/drain diffusion region.

7. The device according to claim 6, wherein
the second word line and the third word line are adjacent to each other, and
the second resistive effect element, the third resistive effect element, the third source/drain diffusion region, and the fourth source/drain diffusion region are arranged between the second word line and the third word line.

8. The device according to claim 7, wherein the second resistive effect element and the third resistive effect element are arranged in a direction in which the first word line and the second word line run.

9. The device according to claim 7, further comprising a contact formed below the second bit line between the third word line and the fourth word line, and connected to the second bit line and the fifth source/drain diffusion region.

10. The device according to claim 1, which further comprises a contact formed below the first bit line between the first word line and the second word line, and connected to the first bit line, and
in which the second source/drain diffusion region is extended from a portion below the second bit line to a portion below the first bit line in a direction in which the first word line and the second word line run, and connected to the contact.

11. The device according to claim 10, wherein the contact has a double-layered structure including an upper contact portion and a lower contact portion.

12. The device according to claim 11, further comprising:
a first lower electrode layer formed below and connected to the first resistive memory element;
a second lower electrode layer formed below and connected to the second resistive memory element; and
a third lower electrode layer formed between the upper contact portion and the lower contact portion, and positioned on the same layer level as that of the first lower electrode layer and the second lower electrode layer.

13. The device according to claim 10, wherein an element region including the first source/drain diffusion region, the second source/drain diffusion region, and the third source/drain diffusion region has a projecting planar shape.

14. The device according to claim 13, wherein
the projecting planar shape has a first portion and a second portion,
the first portion is extended parallel to the first bit line and the second bit line, and formed in a semiconductor substrate below the second bit line, and the second portion is extended parallel to the first word line and the second word line, and formed in the semiconductor substrate between the first word line and the second word line.

15. The device according to claim 1, further comprising:
a first lower electrode layer formed below and connected to the first resistive memory element;
a second lower electrode layer formed below and connected to the second resistive memory element;
a third lower electrode layer formed between the first word line and the second word line, and extended from a portion below the first bit line to a portion below the second bit line in a direction in which the first word line and the second word line run;
a first contact formed below the first resistive memory element, and configured to connect the first lower electrode layer and the first source/drain diffusion region;
a second contact formed below the second resistive memory element, and configured to connect the second lower electrode layer and the third source/drain diffusion region;
a third contact formed below the second bit line between the first word line and the second word line, and configured to connect the third lower electrode layer and the second source/drain diffusion region; and
a fourth contact formed below the first bit line between the first word line and the second word line, and configured to connect the third lower electrode layer and the first bit line.

16. The device according to claim 15, wherein the first lower electrode layer, the second lower electrode layer, and the third lower electrode layer are arranged on the same layer level.

17. The device according to claim 1, further comprising:
an interconnection layer formed between the first word line and the second word line, extended from a portion below the second bit line to a portion below the first bit line in a direction in which the first word line and the second word line run, and laid, in contact with the second source/drain diffusion region, on a semiconductor substrate and an insulating layer formed on the semiconductor layer; and
a contact formed below the first bit line between the first word line and the second word line, and configured to connect the interconnection layer and the first bit line.

18. The device according to claim 17, wherein the insulating layer is an element isolation insulating layer.

19. The device according to claim 1, wherein
each of the first resistive memory element and the second resistive memory element comprises a tunneling magnetoresistive element having a fixed layer in which a magnetization direction is fixed, a recording layer in which a magnetization direction is reversible, and an insulating layer formed between the fixed layer and the recording layer, and
the magnetization direction in the recording layer is reversed by supplying a write current not less than a magnetization reversing threshold current by applying a potential difference to two terminals of each of the first resistive memory element and the second resistive memory element, and the magnetization directions in the fixed layer and the recording layer are caused to take one of a parallel state and an antiparallel state in accordance with a direction of the write current, thereby changing resistance values of the first resistive memory element and the second resistive memory element.

20. The device according to claim 1, wherein each of the first resistive memory element and the second resistive memory element comprises a crystal phase change element.

* * * * *